(12) United States Patent
Kuroda

(10) Patent No.: US 11,172,147 B2
(45) Date of Patent: Nov. 9, 2021

(54) PHOTOELECTRIC CONVERSION DEVICE, METHOD OF DRIVING PHOTOELECTRIC CONVERSION DEVICE, IMAGING SYSTEM, AND MOVABLE OBJECT, GENERATING A SIGNAL BASED ON PULSE WIDTH AND PULSE COUNT

(71) Applicant: CANON KABUSHIKI KAISHA, Tokyo (JP)

(72) Inventor: Yukihiro Kuroda, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/556,473

(22) Filed: Aug. 30, 2019

(65) Prior Publication Data

US 2020/0084396 A1 Mar. 12, 2020

(30) Foreign Application Priority Data

Sep. 6, 2018 (JP) .............................. JP2018-167086

(51) Int. Cl.
*H04N 5/335* (2011.01)
*H04N 5/341* (2011.01)
*H01L 27/146* (2006.01)
*H01L 31/107* (2006.01)

(52) U.S. Cl.
CPC ....... *H04N 5/341* (2013.01); *H01L 27/14643* (2013.01); *H01L 31/107* (2013.01)

(58) Field of Classification Search
CPC .............................. H04N 5/341; H01L 31/107
See application file for complete search history.

(56) References Cited

U.S. PATENT DOCUMENTS

| | | | |
|---|---|---|---|
| 4,152,596 A | * | 5/1979 | Marshall, III ....... G01N 23/222 250/358.1 |
| 5,349,193 A | * | 9/1994 | Mott ......................... G01T 1/17 250/369 |
| 7,709,869 B2 | | 5/2010 | Kuroda |
| 7,911,521 B2 | | 3/2011 | Kuroda |
| 7,935,995 B2 | | 5/2011 | Watanabe |

(Continued)

FOREIGN PATENT DOCUMENTS

| | | |
|---|---|---|
| CN | 106454166 | 2/2017 |
| JP | H11-37851 | 2/1999 |

(Continued)

OTHER PUBLICATIONS

Russian Search Report dated Jun. 30, 2020 in corresponding Russian application No. 2019127794/07(054592). (with whole English translation).

(Continued)

*Primary Examiner* — Gary C Vieaux
(74) *Attorney, Agent, or Firm* — Venable LLP

(57) ABSTRACT

A disclosed photoelectric conversion device includes a plurality of pixels each including a light receiving portion that outputs a pulse in response to incidence of a photon and a signal generation unit that outputs a signal based on output from the light receiving portion, and each of the plurality of pixels further includes a detection unit that detects whether or not a width of a pulse output from the light receiving portion exceeds a predetermined threshold value.

18 Claims, 16 Drawing Sheets

(56) References Cited

U.S. PATENT DOCUMENTS

| | | |
|---|---|---|
| 8,174,599 B2 | 5/2012 | Kuroda |
| 8,222,682 B2 | 7/2012 | Watanabe |
| 8,223,238 B2 | 7/2012 | Kuroda |
| 8,345,137 B2 | 1/2013 | Shinohara |
| 8,390,713 B2 | 3/2013 | Kuroda |
| 8,670,058 B2 | 3/2014 | Hayashi |
| 8,710,558 B2 | 4/2014 | Inoue |
| 8,994,862 B2 | 3/2015 | Kuroda |
| 9,216,737 B1 | 12/2015 | Zhu |
| 9,236,406 B2 | 1/2016 | Kuroda |
| 9,305,954 B2 | 4/2016 | Kato |
| 9,357,122 B2 | 5/2016 | Kususaki |
| 9,445,023 B2 | 9/2016 | Kuroda |
| 9,762,837 B2 | 9/2017 | Kuroda |
| 10,021,316 B2 | 7/2018 | Kuroda |
| 10,024,979 B1 | 7/2018 | Viswanath |
| 10,283,651 B2 | 5/2019 | Morimoto |
| 10,404,932 B2 | 9/2019 | Kuroda |
| 2007/0154068 A1 | 7/2007 | Stein |
| 2008/0291296 A1 | 11/2008 | Oike |
| 2009/0200449 A1 | 8/2009 | Iwata |
| 2011/0210235 A1 | 9/2011 | Dierickx |
| 2012/0086841 A1 | 4/2012 | Ono |
| 2012/0175503 A1 | 7/2012 | Kuroda |
| 2012/0305786 A1 | 12/2012 | Dierickx |
| 2013/0010921 A1 | 1/2013 | Sagoh |
| 2014/0103196 A1* | 4/2014 | Soga ............... H01L 27/144 250/208.2 |
| 2014/0328466 A1* | 11/2014 | Proksa ............... G06F 7/64 378/62 |
| 2015/0222831 A1 | 8/2015 | Hashimoto |
| 2016/0219234 A1 | 7/2016 | Nishihara |
| 2017/0123082 A1 | 5/2017 | Nakamura |
| 2017/0230037 A1 | 8/2017 | Dandin |
| 2018/0102386 A1* | 4/2018 | Kobayashi ........... H04N 5/2353 |
| 2018/0108800 A1 | 4/2018 | Morimoto et al. |
| 2018/0316884 A1 | 11/2018 | Kuroda |
| 2019/0238780 A1 | 8/2019 | Goden |
| 2019/0305146 A1 | 10/2019 | Kuroda |
| 2020/0191958 A1* | 6/2020 | Ikuta ................... G01C 3/06 |

FOREIGN PATENT DOCUMENTS

| | | |
|---|---|---|
| JP | 2005-57612 | 3/2005 |
| JP | 2012-3005 | 1/2012 |
| JP | 2013-000227 | 1/2013 |
| JP | 2014-081253 | 5/2014 |
| JP | 2016-146286 A | 8/2016 |
| JP | 2016-156748 | 9/2016 |
| JP | 2017-083298 | 5/2017 |
| JP | 2018-88494 | 6/2018 |
| RU | 2010136266 | 3/2012 |
| WO | 2017/032548 | 3/2017 |

OTHER PUBLICATIONS

Russian Decision to Grant a Patent dated Sep. 4, 2020 in corresponding Russian application No. 2019127794/07(054592).(with whole English translation).

U.S. Appl. No. 16/670,178, filed Oct. 31, 2019, by Yasuharu Ota.

European Search Report dated Nov. 28, 2019 during prosecution of related European application No. 19195534.3.

Japanese Office Action dated Sep. 8, 2020 in corresponding Japanese Application No. 2018-167086 (with whole English translation).

Japanese Search Report dated Apr. 6, 2021 in corresponding Japanese Application No. 2018-167086 (English Translation Included).

Indian Office Action dated Aug. 24, 2021 in corresponding Indian Application No. 2019-44035567 (English Translation Included).

* cited by examiner

PHOTOELECTRIC CONVERSION DEVICE, METHOD OF DRIVING PHOTOELECTRIC CONVERSION DEVICE, IMAGING SYSTEM, AND MOVABLE OBJECT, GENERATING A SIGNAL BASED ON PULSE WIDTH AND PULSE COUNT

BACKGROUND OF THE INVENTION

Field of the Invention

The present invention relates to a photoelectric conversion device, a method of driving the photoelectric conversion device, an imaging system, and a movable object.

Description of the Related Art

A photoelectric conversion device that digitally counts the number of photons arriving at a light receiving portion and outputs the count value from a pixel as a digital signal is known. Japanese Patent Application Laid-Open No. 2017-083298 discloses a readout circuit including a count circuit that counts the number of photons entering a photoelectric conversion element, an integration circuit that integrates an output current of the photoelectric conversion element to generate a voltage signal, and a signal processing unit that determines the level of an incident light based on the count result and the voltage signal. Japanese Patent Application Laid-Open No. 2017-083298 discloses that, with such a configuration of the readout circuit, it is possible to support a wide range of light amount.

In Japanese Patent Application Laid-Open No. 2017-083298, however, there is no consideration of a situation where a plurality of signals output from photoelectric conversion elements interfere with each other and are unable to be separated as a voltage pulse. Thus, in particular at high luminance, the output value from a count circuit may be much lower than the ideal value, and an error of the count value may increase.

SUMMARY OF THE INVENTION

The present invention intends to provide a photon-count type photoelectric conversion device having an improved photoelectric conversion operation at high luminance.

According to one aspect of the present invention, provided is a photoelectric conversion device including a plurality of pixels each including a light receiving portion that outputs a pulse in response to incidence of a photon and a signal generation unit that outputs a signal based on output from the light receiving portion, and each of the plurality of pixels further includes a detection unit that detects whether or not a width of a pulse output from the light receiving portion exceeds a predetermined threshold value.

According to another aspect of the present invention, provided is a method of driving a photoelectric conversion device including a light receiving portion that outputs a pulse in response to incidence of a photon and a signal generation unit that outputs a signal based on output from the light receiving portion, and the method includes detecting whether or not a width of a pulse output from the light receiving portion exceeds a predetermined threshold value.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

A photoelectric conversion device and a method driving the same according to a first embodiment of the present invention will be described with reference to FIG. 1 to FIG.

Figure 2:
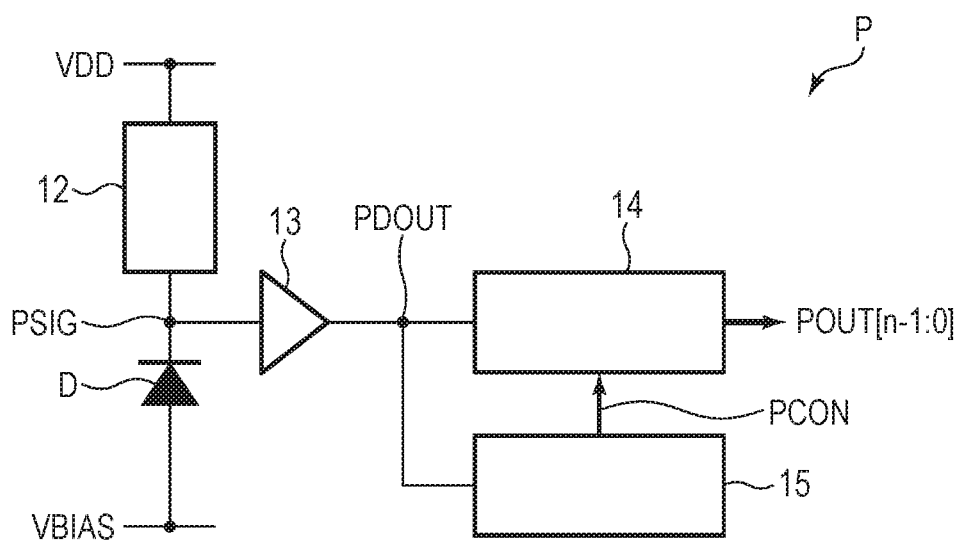
FIG. 2 is a schematic diagram illustrating a configuration example of a pixel of the photoelectric conversion device according to the first embodiment of the present invention.
Figure 3A:
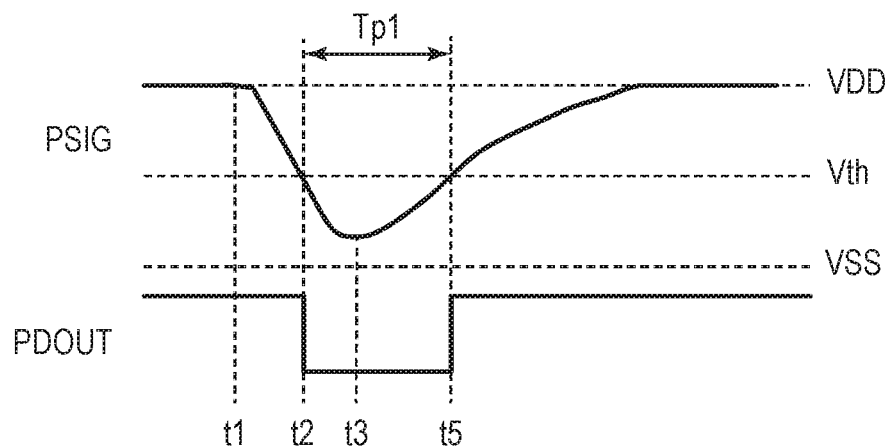
FIG. 3A and FIG. 3B are timing diagrams illustrating an operation of a pulse conversion unit of the photoelectric conversion device according to the first embodiment of the present invention.
Figure 3B:
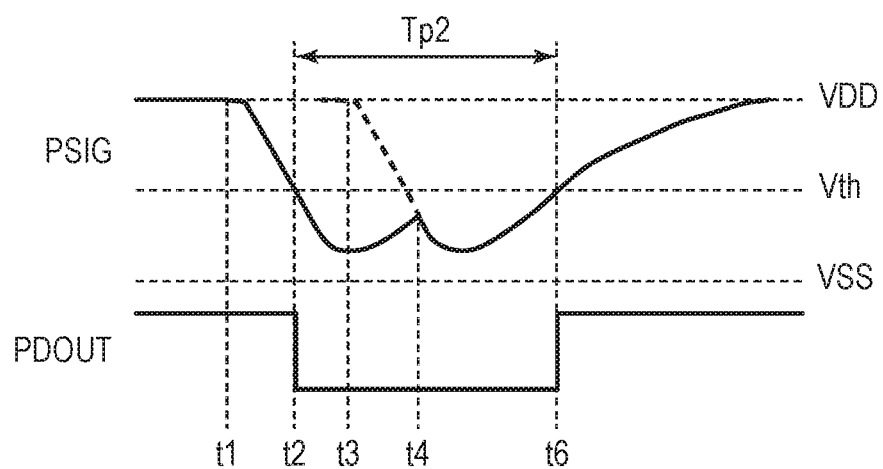
Figure 4:
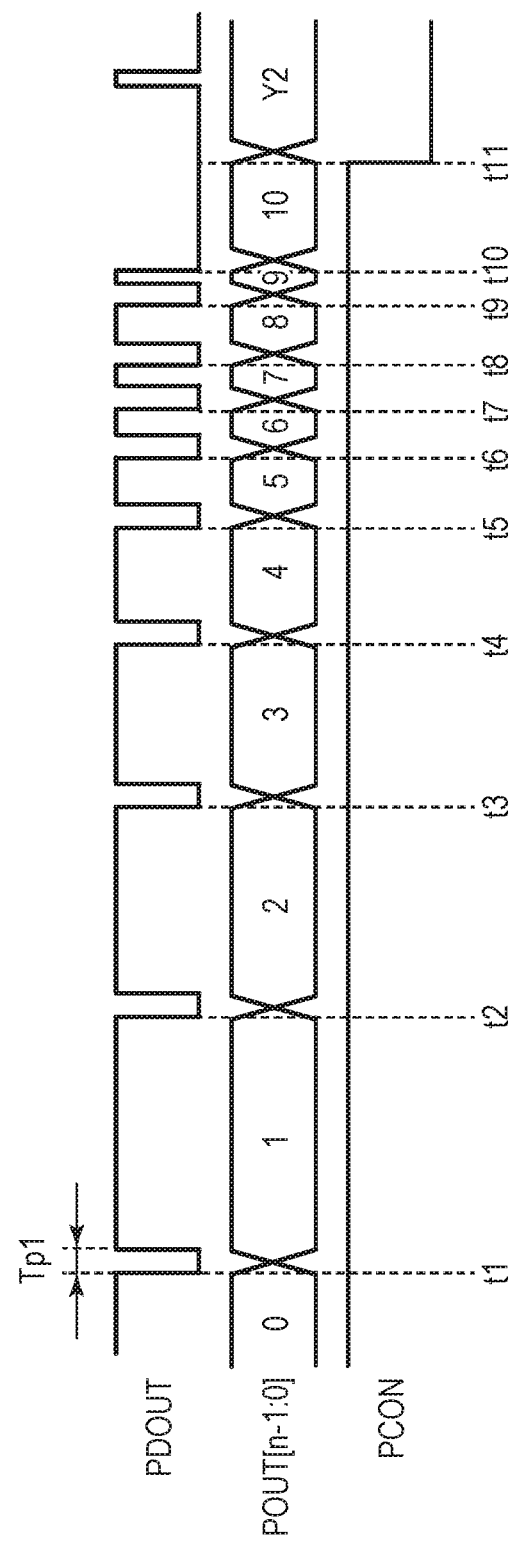
FIG. 4 is a timing diagram illustrating the operation of the pixels of the photoelectric conversion device according to the first embodiment of the present invention.
Figure 5:
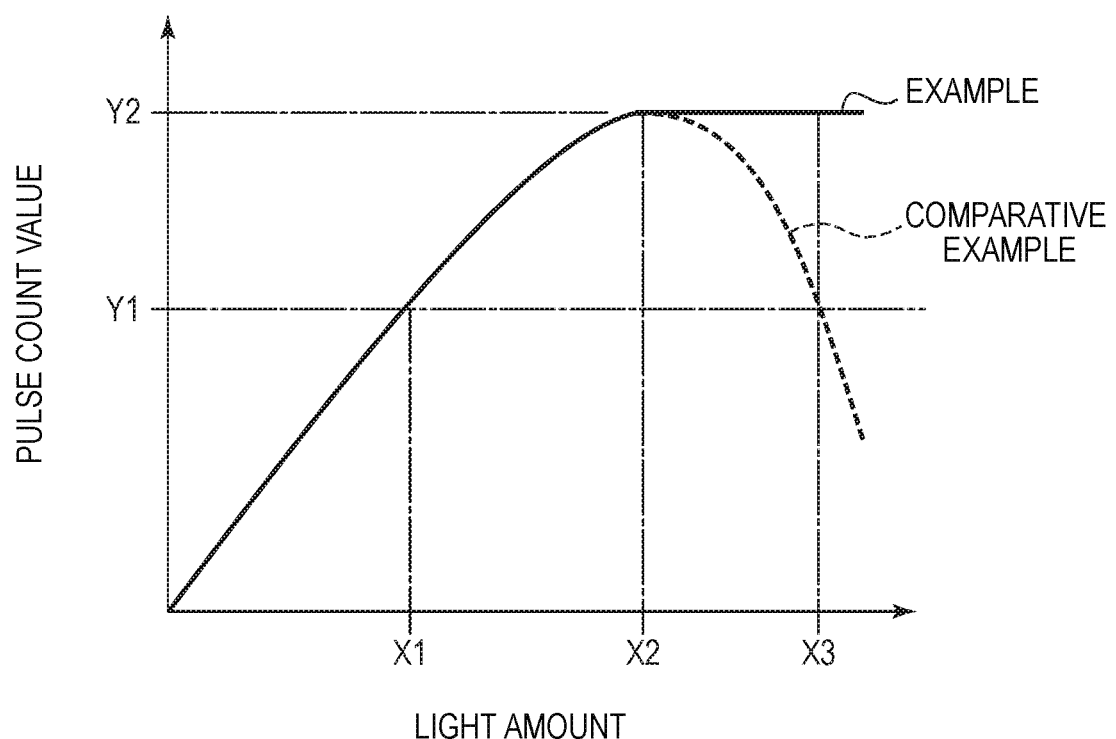
FIG. 5 is a diagram illustrating an example of the photoelectric conversion characteristic of the photoelectric conversion device according to the first embodiment of the present invention.

5. FIG. 1 is a block diagram illustrating a general configuration of a photoelectric conversion device according to the present embodiment. FIG. 2 is a schematic diagram illustrating a configuration example of a pixel of the photoelectric conversion device according to the present embodiment. FIG. 3A and FIG. 3B are timing diagrams illustrating an operation of a pulse conversion unit of the photoelectric conversion device according to the present embodiment. FIG. 4 is a timing diagram illustrating the operation of the pixels of the photoelectric conversion device according to the present embodiment. FIG. 5 is a diagram illustrating an example of the photoelectric conversion characteristic of the photoelectric conversion device according to the present embodiment.

Figure 1:
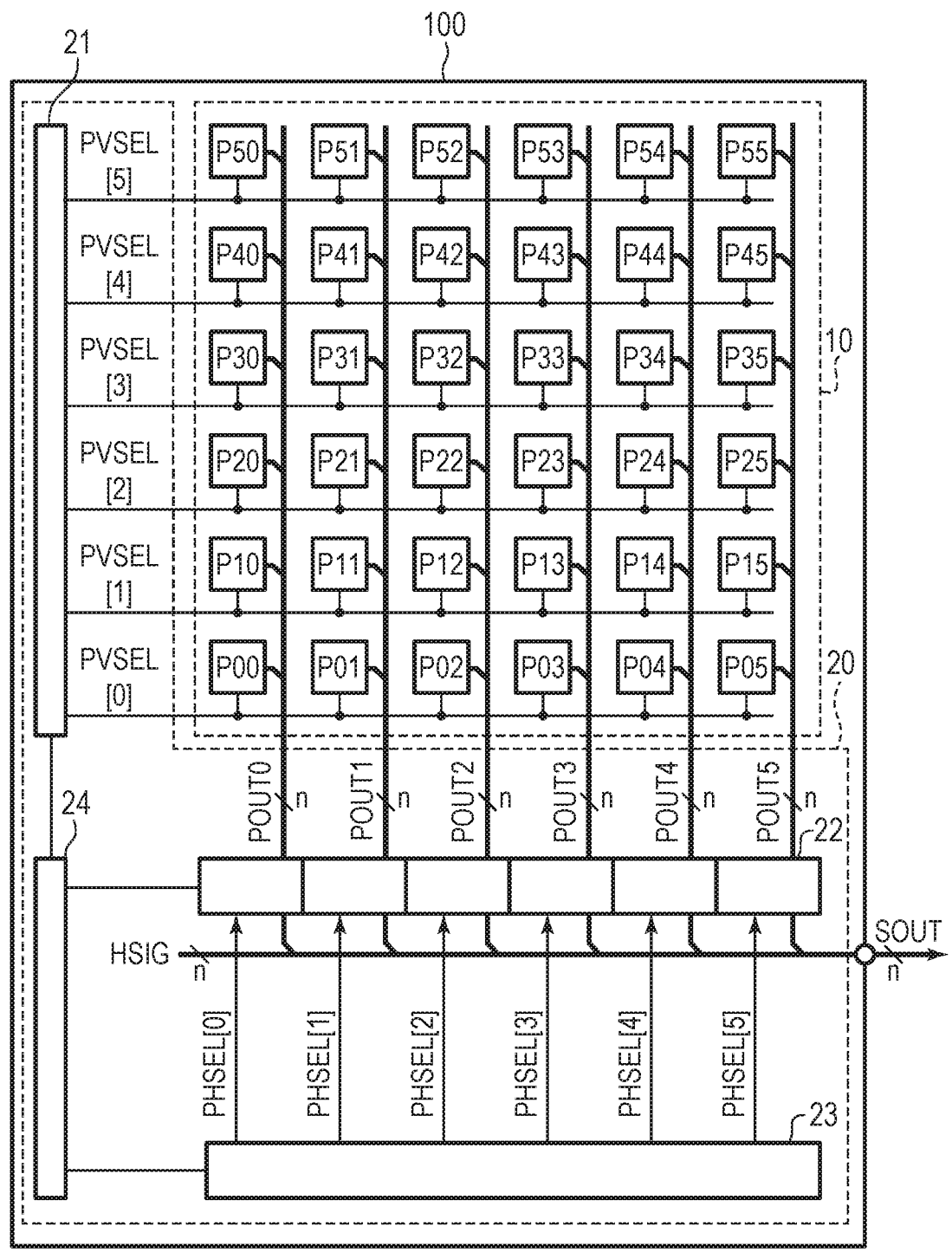
FIG. 1 is a block diagram illustrating a general configuration of a photoelectric conversion device according to a first embodiment of the present invention.

As illustrated in FIG. 1, the photoelectric conversion device 100 according to the present embodiment includes a sensor unit 10 and a circuit unit 20. The circuit unit 20 includes a vertical select circuit 21, signal processing circuits 22, a horizontal select circuit 23, and a control circuit 24.

The sensor unit 10 is provided with a plurality of pixels P arranged in a matrix in a plurality of row directions and a plurality of column directions. FIG. 1 illustrates 36 pixels P arranged on 6 rows from the 0th row to the 5th row and 6 columns from the 0th column to the 5th column along with references each indicating a row number and a column number. For example, the pixel P arranged at the first row, the fourth column is labeled with the reference "P14". Note that the number of rows and the number of columns of the pixel array forming the sensor unit 10 are not particularly limited.

On each row of the pixel array of the sensor unit 10, a control line for supplying a control signal PVSEL is arranged extending in a first direction (horizontal direction in FIG. 1). Each of the control lines is connected to the pixels P aligned in the first direction, respectively, and forms a signal line common to these pixels P. The first direction in which the control line extends may be referred to as a row direction or a horizontal direction. Note that, in FIG. 1, the control signal PVSEL supplied to each of the control lines is illustrated together with a reference indicating a row number. For example, the control line on the first row is labeled with the reference "PVSEL [1]".

The control line on each row is connected to the vertical select circuit 21. The vertical select circuit 21 is a circuit unit that provides, to the pixel P via a control line, a control signal PVSEL used for driving a signal generation circuit (corresponding to a signal generation unit 14 described below) in the pixel P.

On each column of the pixel array of the sensor unit 10, an output line POUT is arranged extending in a second direction (vertical direction in FIG. 1) intersecting the first direction. Each of the output lines POUT is connected to the pixels P aligned in the second direction, respectively, and forms a signal line common to these pixels P. The second direction in which the output line POUT extends may be referred to as a column direction or a vertical direction. Note that, in FIG. 1, each of the output lines POUT is illustrated together with a reference indicating a column number. For example, the output line in the fourth column is labeled with the reference "POUT4". Each of the output lines POUT includes n signal lines used for outputting an n-bit digital signal.

The output lines POUT are connected to the signal processing circuits 22. The signal processing circuits 22 are provided in association with respective columns of the pixel array of the sensor unit 10 and connected to the output line POUT on the corresponding column. Each signal processing circuit 22 has a function of holding a signal read out from the pixels P via the output line POUT on the corresponding column. Since the signals output from the pixels P correspond to an n-bit signals input via the n signal lines of the output lines POUT, each of the signal processing circuits 22 includes at least n holding units for holding signals of respective bits.

The horizontal select circuit 23 is a circuit unit that supplies a control signal used for reading out a signal from the signal processing circuit 22 to the signal processing circuit 22. The horizontal select circuit 23 supplies a control signal PHSEL to the signal processing circuit 22 on each column via a control line. The signal processing circuit 22 that has received the control signal PHSEL from the horizontal select circuit 23 externally outputs a signal held in the holding unit as an output signal SOUT of the photoelectric conversion device 100 via a horizontal output line HSIG. Note that, in FIG. 1, the control signal PHSEL supplied to each control line is illustrated together with a reference indicating a column number. For example, the control line in the fourth column is labeled with the reference "PHSEL [4]". The horizontal output line HSIG includes n signal lines used for outputting an output signal SOUT formed of an n-bit digital signal.

The control circuit 24 is a circuit unit used for providing control signals that control operations or the timing of the operations of the vertical select circuit 21, the signal processing circuits 22, and the horizontal select circuit 23. Note that, at least some of the control signals that control operations or the timing of the operations of the vertical select circuit 21, the signal processing circuits 22, and the horizontal select circuit 23 may be provided from the outside of the photoelectric conversion device 100.

As illustrated in FIG. 2, each pixel P includes an avalanche multiplying diode D, a quench unit 12, a pulse conversion unit 13, a signal generation unit 14, and a period detection unit 15.

The anode of the diode D is connected to a power supply node that supplies a voltage VBIAS. The cathode of the diode D is connected to one terminal of the quench unit 12 and the input terminal of the pulse conversion unit 13. Hereafter, a connection node of the cathode of the diode D, one terminal of the quench unit 12, and the input terminal of the pulse conversion unit 13 is referred to as a node PSIG. The other terminal of the quench unit 12 is connected to a power supply node that supplies the voltage VDD. The output terminal of the pulse conversion unit 13 is connected to the input terminal of the signal generation unit 14 and the input terminal of the period detection unit 15. Hereafter, a connection node of the output terminal of the pulse conversion unit 13, the input terminal of the signal generation unit 14, and the input terminal of the period detection unit 15 is referred to as a node PDOUT. The period detection unit 15 outputs a control signal PCON to the signal generation unit 14. The signal generation unit 14 outputs the signal POUT [n-1:0] to the output line POUT on the corresponding column.

A reverse bias voltage greater than or equal to the breakdown voltage is applied to the diode D from the power supply node that supplies the voltages VDD and VBIAS via the quench unit 12. The voltage VDD and the voltage VBIAS are power supply voltages supplied to the diode D, respectively. Thereby, the diode D is in a state capable of operating in a Geiger mode. When photons enter the diode D, a large number of electrons (and holes) are generated by avalanche multiplication using the electrons excited by the incident photons as seeds. When a current generated by avalanche multiplication flows in the quench unit 12, a voltage drop occurs in the quench unit 12, and as a result, the voltage applied to the diode D decreases, and the operation region of the diode D transitions to a non-Geiger mode. When the avalanche multiplication of the diode D stops, the voltage drop of the quench unit 12 returns to the original state, and the operation region of the diode D transitions to a Geiger mode again.

The pulse conversion unit 13 converts a change in the potential of the cathode (node PSIG) of the diode D into a pulse signal whose state transitions in accordance with a predetermined threshold value. With such a configuration, a voltage pulse in accordance with incidence of a photon is output from the output terminal (node PDOUT) of the pulse conversion unit 13. That is, the diode D, the quench unit 12, and the pulse conversion unit 13 form a light receiving portion that outputs a pulse in response to incidence of a photon.

The signal generation unit 14 is, e.g., a signal generation circuit that counts voltage pulses output from the pulse conversion unit 13 and outputs the result as the signal POUT [n−1:0]. The signal POUT [n−1:0] is an n-bit digital signal. The output terminal of the signal generation unit 14 includes n signal lines used for outputting the signal POUT [n−1:0] for respective bits.

The period detection unit 15 is, e.g., a detection circuit configured to be able to detect the width of a voltage pulse (the length of a period during which the signal level is maintained at a high level or low level) output from the pulse conversion unit 13. The period detection unit 15 detects whether or not the width of a voltage pulse output from the light receiving portion exceeds a predetermined threshold value. The period detection unit 15 then outputs the control signal PCON in association with the detection result to the signal generation unit 14. That is, the period detection unit 15 includes a control unit that controls the signal generation unit 14 in association with the detection result of the width of the voltage pulse. The control signal PCON is a signal whose state transitions when the width of a voltage pulse indicating incidence of a photon exceeds a predetermined threshold value.

Next, operations of the pulse conversion unit 13 and the period detection unit 15 will be described in more detail by using FIG. 3A, FIG. 3B, and FIG. 4.

When no photon enters the diode D, the potential of the cathode (node PSIG) of the diode D is at the voltage VDD. At this time, the signal level of the output terminal (node PDOUT) of the pulse conversion unit 13 is assumed to be a predetermined high level.

FIG. 3A is a timing diagram illustrating the operation of the pulse conversion unit 13 when one photon enters the diode D. In FIG. 3A, "PSIG" denotes the potential of the node PSIG, and "PDOUT" denotes the potential of the node PDOUT.

As illustrated in FIG. 3A, when a photon enters the diode D at the time t1, a current generated by avalanche multiplication flows in the quench unit 12 and a voltage drop occurs in the quench unit 12. Thereby, the potential of the node PSIG gradually decreases from the voltage VDD.

At the time t2, when the potential of the node PSIG becomes lower than a predetermined threshold value Vth, the level of the potential of the node PDOUT transitions from the high level to a predetermined low level.

At the time t3, when the operation region of the diode D is out of the Geiger mode and the avalanche multiplication of the diode D stops, the voltage drop of the quench unit 12 starts returning to the original state.

At the time t5, when the potential of the node PSIG becomes higher than or equal to the threshold value Vth, the level of the potential of the node PDOUT returns to the high level from the low level.

In such a way, once one photon enters the diode D, a voltage pulse whose low level period is a period Tp1 is output from the pulse conversion unit 13 to the node PDOUT. The length of the period Tp1 depends on the physical constant forming the diode D and the circuit constant of the quench unit 12 and the pulse conversion unit 13 and becomes substantially a constant value.

Although FIG. 3A illustrates the case where one voltage pulse is generated for one photon incidence, the photon incidence may not correspond to the voltage pulse generation in a one-to-one manner for certain timings of photon incidence. One example thereof will be described by using a timing diagram of FIG. 3B.

FIG. 3B is a timing diagram illustrating the operation of the pulse conversion unit 13 when two photons enter the diode D within a short period of time. In FIG. 3B, "PSIG" denotes the potential of the node PSIG, and "PDOUT" denotes the potential of the node PDOUT.

As illustrated in FIG. 3B, when a photon enters the diode D at the time t1, a current generated by avalanche multiplication flows in the quench unit 12 and a voltage drop occurs in the quench unit 12. Thereby, the potential of the node PSIG gradually decreases from the voltage VDD.

At the time t2, when the potential of the node PSIG becomes lower than the predetermined threshold value Vth, the level of the potential of the node PDOUT transitions from the high level to a predetermined low level.

At the time t3, when the operation region of the diode D is out of the Geiger mode and the avalanche multiplication of the diode D stops, the voltage drop of the quench unit 12 starts returning to the original state. However, when there is an incident photon again at the time t3, for example, the potential of the node PSIG decreases again at the time t4 before exceeding the threshold value Vth. When the avalanche multiplication due to the incidence of the second photon stops, the voltage drop of the quench unit 12 starts returning.

At the time t6, when the potential of the node PSIG becomes higher than or equal to the threshold value Vth, the level of the potential of the node PDOUT returns to the high level from the low level.

In this case, while a voltage pulse whose low level period is a period Tp2 is output from the pulse conversion unit 13 to the node PDOUT, the number of voltage pulses output from the pulse conversion unit 13 is less than the number of photons entering the diode D. Such a phenomenon is caused by the fact that the incident rate of photons exceeds the generation rate of voltage pulses and becomes significant in a high luminance environment.

FIG. 4 is a timing diagram illustrating the relationship of the potential of the node PDOUT, the signal POUT [n−1:0], and the control signal PCON.

In the period before time t1, the count value represented by the signal POUT [n−1:0] output by the signal generation unit 14 is zero (0). Further, the control signal PCON is at a predetermined high level when the width of a voltage pulse is less than or equal to a predetermined threshold value and transitions to a predetermined low level when the width of the voltage pulse exceeds the predetermined threshold value. In the period before time t1, the control signal PCON is at the high level.

As illustrated in FIG. 4, there is an incident photon at each timing of time t1, t2, t3, t4, t5, t6, t7, t8, t9, and t10. In such a way, a voltage pulse in accordance with the incident timing of a photon is output from the pulse conversion unit 13 to the node PDOUT.

The signal generation unit 14 counts voltage pulses output from the pulse conversion unit 13 to the node PDOUT and outputs the result thereof as the signal POUT [n−1:0]. FIG. 4 illustrates the case where the signal generation unit 14 counts voltage pulses generated in response to incident timings of photons at the time t1, t2, t3, . . . , and count values corresponding to decimal numbers 1, 2, 3, . . . are sequentially output as the signal POUT [n−1:0].

Here, at the time t10, a voltage pulse having a width longer than the period Tp1, which is a pulse width in accordance with incidence of one photon, is output from the pulse conversion unit 13. This is under assumption of a light incidence of high luminance as described by using FIG. 3B.

The period detection unit 15 causes the control signal PCON to transition from the high level to the low level when the width of a voltage pulse (length of the low level period) output to the node PDOUT exceeds a predetermined time period. For example, as illustrated in FIG. 4, the period detection unit 15 causes the control signal PCON to transition from the high level to the low level at the time t11 when the length of a period in which the voltage pulse is the low level exceeds a predetermined time period.

The signal generation unit 14 that has received the low level control signal PCON from the period detection unit 15 outputs a digital value in accordance with a predetermined fixed value Y2 as the signal POUT [n−1:0], for example. The fixed value Y2 can be set to a pulse count value corresponding to the light amount obtained when the incident rate of photons exceeds the pulse generation rate, for example.

FIG. 5 is a graph illustrating an example of the photoelectric conversion characteristic of the pixel P. In FIG. 5, the horizontal axis represents the incident light amount to the pixel P, and the vertical axis represents the count value of voltage pulses generated by the incidence of photons. The value on the vertical axis corresponds to the value of the signal POUT [n−1:0] output by the signal generation unit 14.

In a case where the incident light amount to the pixels P is relatively small, incidence of a photon substantially corresponds to generation of a voltage pulse in a one-to-one manner, as described by using FIG. 3A. Thus, when the light amount is less than or equal to X2, for example, the pulse count value also increases as the incident light amount increases.

However, when the incident light amount to the pixels P increases, the incidence rate of photons exceeds the generation rate of voltage pulses, and this results in a state where one voltage pulse is generated in response to the incidence of a plurality of photons, as described by using FIG. 3B. This degree becomes more significant as the incident light amount to the pixels P is larger.

Therefore, when the incident light amount to the pixels P exceeds the light amount X2 in a pixel configuration without the period detection unit 15, the pulse count value will decrease as the light amount increases, as indicated by the broken line in FIG. 5 as "comparative example". For example, in the light amount X1 and the light amount X3, the pulse count value is the same Y1, and the difference in the light amount is not distinguishable.

On the other hand, the present embodiment is configured such that, when the length of the period in which the voltage pulse is at the low level exceeds a predetermined time period, a digital value in accordance with a predetermined fixed value Y2 is output as the signal POUT [n−1:0]. When this fixed value Y2 is set to a pulse number cumulative addition value in accordance with the light amount X2, the pulse count value becomes the fixed value Y2 at the light amount X2 or greater, as illustrated by the solid line in FIG. 5 as "example". It is therefore possible to prevent the pulse count value from decreasing when the light amount X2 is exceeded and reduce an error in a count value.

In such way, in the photoelectric conversion device according to the present embodiment, the period detection unit 15 detects a period of the pulse width of a voltage pulse output from the pulse conversion unit 13 and outputs, to the signal generation unit 14, the control signal PCON whose state transitions in accordance with a predetermined threshold value. Thereby, the signal generation unit 14 can determine whether or not the incidence rate of photons exceeds the generation rate of voltage pulses and can reduce an error in the count value at high luminance.

In such a way, according to the present embodiment, in the photon count type photoelectric conversion device, it is possible to reduce an error in a count value at high luminance. This can improve the photoelectric conversion operation at high luminance.

Second Embodiment

Figure 6:
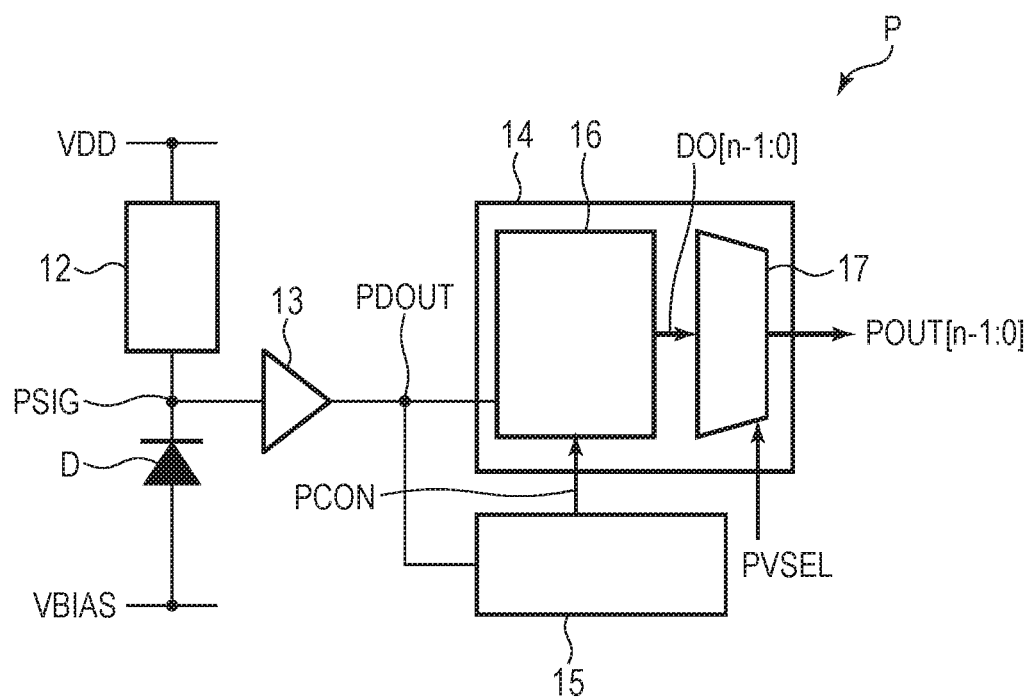
FIG. 6 is a schematic diagram illustrating a configuration example of a pixel of a photoelectric conversion device according to a second embodiment of the present invention.
Figure 7:
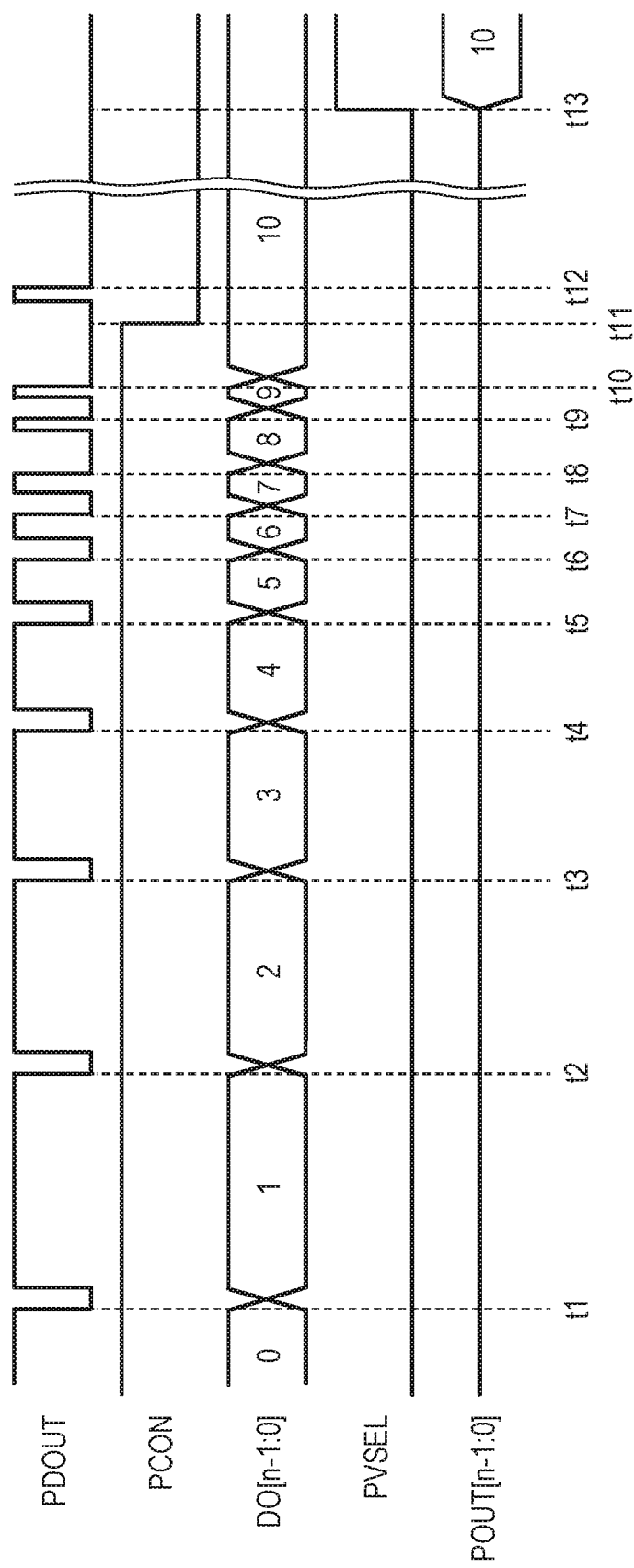
FIG. 7 is a timing diagram illustrating the operation of the pixel of the photoelectric conversion device according to the second embodiment of the present invention.

A photoelectric conversion device and a method of driving the same according to a second embodiment of the present invention will be described with reference to FIG. 6 and FIG. 7. Components similar to those of the photoelectric conversion device according to the first embodiment are labeled with the same references, and the description thereof will be omitted or simplified. FIG. 6 is a schematic diagram illustrating a configuration example of a pixel of the photoelectric conversion device according to the present embodiment. FIG. 7 is a timing diagram illustrating the operation of the pixel of the photoelectric conversion device according to the present embodiment.

In the present embodiment, one example of more specific configuration and operation of the signal generation unit 14 will be described. As illustrated in FIG. 6, the signal generation unit 14 in the photoelectric conversion device according to the present embodiment includes a counter unit 16 and a selector unit 17. The counter unit 16 is connected to the pulse conversion unit 13 and the period detection unit 15. The selector unit 17 is connected to the counter unit 16.

The counter unit 16 counts the number of voltage pulses output from the pulse conversion unit 13 to the node PDOUT and outputs a signal DO [n−1:0] representing a count value to the selector unit 17. FIG. 6 illustrates a case where the counter unit 16 includes an n-bit counter as an example. Further, the counter unit 16 is configured to stop a count operation in response to a control signal PCON supplied from the period detection unit 15.

The selector unit 17 outputs the signal DO [n−1:0], which is output from the counter unit 16, to the output line POUT as a signal POUT [n−1:0] based on a control signal PVSEL supplied from the vertical select circuit 21. Each of the signal line and the output line to which the signal DO [n−1:0] is output from the counter unit 16 POUT includes n signal lines used for outputting an n-bit digital signal.

FIG. 7 is a timing diagram illustrating a relationship of the potential of the node PDOUT, the control signal PCON, the signal DO [n−1:0], the control signal PVSEL, and the signal POUT [n−1:0].

In the period before the time t1, the count value indicated by the signal DO [n−1:0] output by the counter unit 16 is zero (0). Further, the control signal PCON is at a predetermined high level when the width of the voltage pulse is less than or equal to a predetermined threshold value and transitions to a predetermined low level when the width of the voltage pulse exceeds a predetermined threshold value. In the period before the time t1, the control signal PCON is at the high level. In the period before the time t1, the control signal PVSEL is at the low level.

As illustrated in FIG. 7, there is an incident photon at each timing of the time t1, t2, t3, t4, t5, t6, t7, t8, t9, t10, and t12. Thereby, a voltage pulse in accordance with the incidence timing of a photon is output from the pulse conversion unit 13 to the node PDOUT.

The counter unit 16 counts voltage pulses output from the pulse conversion unit 13 to the node PDOUT and outputs the count result as the signal DO [n–1:0]. FIG. 7 illustrates a case where the counter unit 16 counts voltage pulses occurring in accordance with the incidence timings of photons at the time t1, t2, t3, . . . and sequentially outputs count values corresponding to decimal 1, 2, 3, . . . as the signal DO [n–1:0].

Here, at the time t10, a voltage pulse having a width longer than the period Tp1 that is a pulse width corresponding to incidence of one photon is output from the pulse conversion unit 13. This is under assumption of a light incidence of high luminance as described by using FIG. 3B.

The period detection unit 15 causes the control signal PCON to transition from the high level to the low level when the width of a voltage pulse output to the node PDOUT (the length of a low level period) exceeds a predetermined time period. For example, as illustrated in FIG. 7, the period detection unit 15 causes the control signal PCON to transition from the high level to the low level at the time t11 when the length of a period in which a voltage pulse is at the low level exceeds a predetermined time period.

The counter unit 16 stops a count operation in response to receiving the low level control signal PCON and holds a count value when the count operation stops. Even if a voltage pulse is output from the pulse conversion unit 13 at the subsequent time t12, the counter unit 16 directly holds the count value without change.

At the time t13, in response to the control signal PVSEL supplied from the vertical select circuit 21 being controlled to the high level, the selector unit 17 outputs the count value held by the counter unit 16 to the output line POUT as the signal POUT [n–1:0].

As described above, according to the present embodiment, in a photon-count type photoelectric conversion device, an error of a count value at high luminance can be reduced. This can improve the photoelectric conversion operation at high luminance.

Third Embodiment

Figure 8:
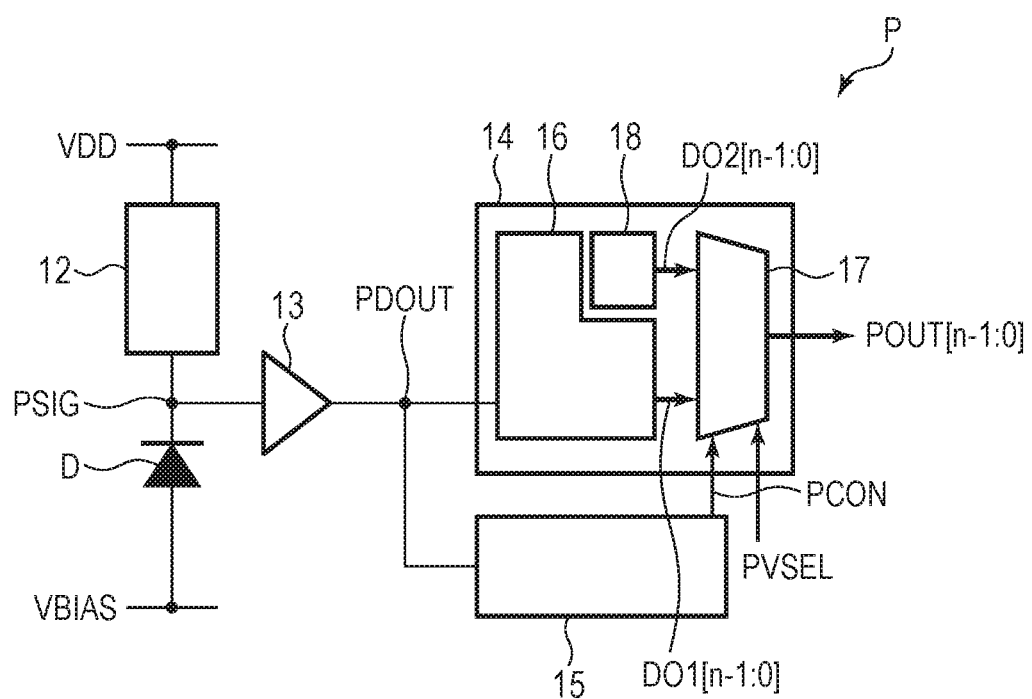
FIG. 8 is a schematic diagram illustrating a configuration example of a pixel of a photoelectric conversion device according to a third embodiment of the present invention.
Figure 9:
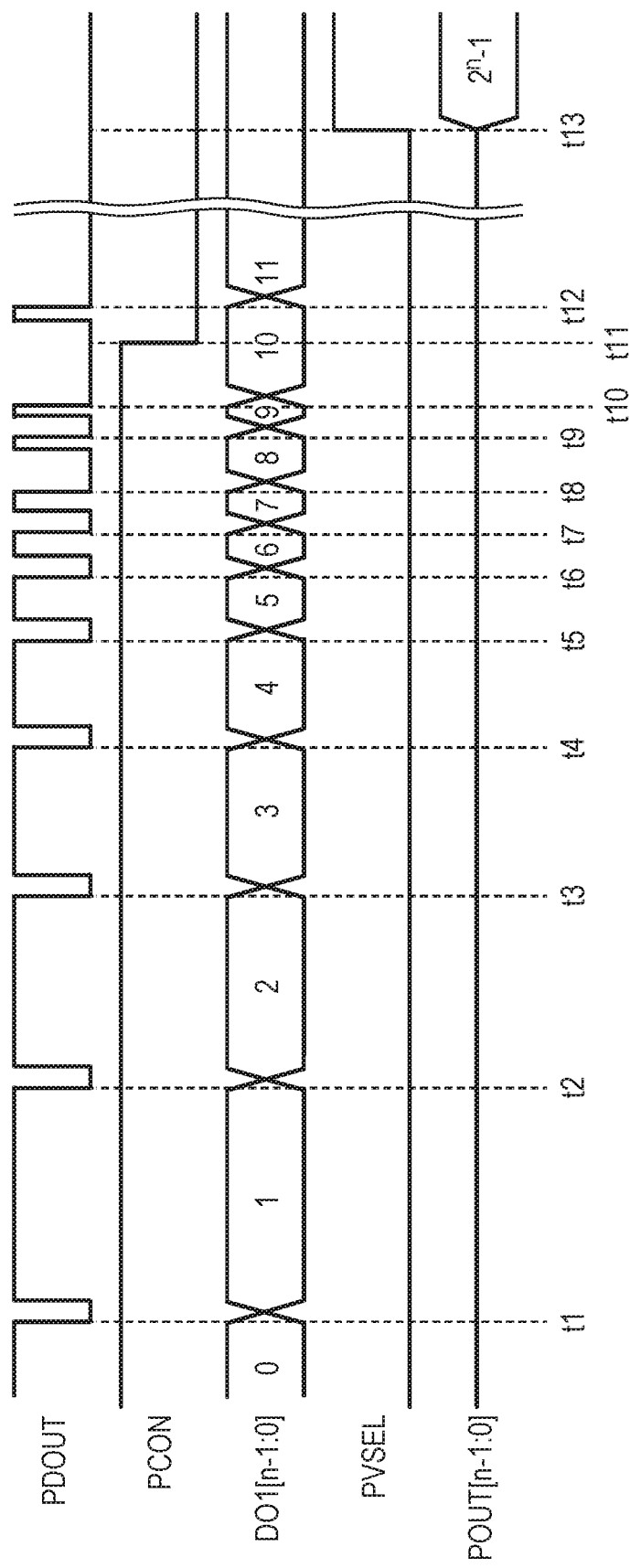
FIG. 9 is a timing diagram illustrating the operation of the pixel of the photoelectric conversion device according to the third embodiment of the present invention.

A photoelectric conversion device and a method of driving the same according to a third embodiment of the present invention will be described with reference to FIG. 8 and FIG. 9. Components similar to those of the photoelectric conversion device according to the first and second embodiments are labeled with the same references, and the description thereof will be omitted or simplified. FIG. 8 is a schematic diagram illustrating a configuration example of a pixel of the photoelectric conversion device according to the present embodiment. FIG. 9 is a timing diagram illustrating the operation of the pixel of the photoelectric conversion device according to the present embodiment.

In the present embodiment, another example of more specific configuration and operation of the signal generation unit 14 will be described. As illustrated in FIG. 8, the signal generation unit 14 in the photoelectric conversion device according to the present embodiment further includes a substitute-signal generation unit 18 in addition to the counter unit 16 and the selector unit 17 described in the second embodiment. The counter unit 16 is connected to the pulse conversion unit 13 and the period detection unit 15. The selector unit 17 is connected to the counter unit 16 and the substitute-signal generation unit 18.

The counter unit 16 counts the number of voltage pulses output from the pulse conversion unit 13 to the node PDOUT and outputs a signal DO1 [n–1:0] representing a count value to the selector unit 17. FIG. 8 illustrates a case where the counter unit 16 includes an n-bit counter as one example.

The substitute-signal generation unit 18 generates and outputs a signal DO2 [n–1:0] representing a predefined substitute-signal value that may be a substitute value of a count value output by the counter unit 16 to the selector unit 17.

The selector unit 17 selects one of the signal DO1 [n–1:0] supplied from the counter unit 16 and the signal DO2 [n–1:0] supplied from the substitute-signal generation unit 18 based on the control signal PCON supplied from the period detection unit 15. The selector unit 17 then outputs the selected signal (the signal DO1 [n–1:0] or the signal DO2 [n–1:0]) to the output line POUT based on the control signal PVSEL supplied from the vertical select circuit 21. Each of the signal line to which the signal DO1 [n–1:0] is output from the counter unit 16, the signal line to which the signal DO2 [n–1:0] is output from the substitute-signal generation unit 18, and the output line POUT includes n signal lines used for outputting an n-bit digital signal.

FIG. 9 is a timing diagram illustrating a relationship of the potential of the node PDOUT, the control signal PCON, the signal DO1 [n–1:0], the control signal PVSEL, and the signal POUT [n–1:0].

In the period before the time t1, the count value indicated by the signal DO1 [n–1:0] output by the counter unit 16 is zero (0). Further, the control signal PCON is at a predetermined high level when the width of the voltage pulse is less than or equal to a predetermined threshold value and transitions to a predetermined low level when the width of the voltage pulse exceeds a predetermined threshold value. In the period before the time t1, the control signal PCON is at the high level. Further, in the period before the time t1, the control signal PVSEL is at the low level.

As illustrated in FIG. 9, there is an incident photon at each timing of the time t1, t2, t3, t4, t5, t6, t7, t8, t9, t10, and t12. Thereby, the voltage pulse in accordance with the incidence timing of a photon is output from the pulse conversion unit 13 to the node PDOUT.

The counter unit 16 counts voltage pulses output from the pulse conversion unit 13 to the node PDOUT and outputs the count result as the signal DO1 [n–1:0]. FIG. 9 illustrates a case where the counter unit 16 counts voltage pulses occurring in accordance with the incidence timings of photons at the time t1, t2, t3, . . . and sequentially outputs count values corresponding to decimal 1, 2, 3, . . . as the signal DO1 [n–1:0].

Here, at the time t10, a voltage pulse having a width longer than the period Tp1 that is a pulse width corresponding to incidence of one photon is output from the pulse conversion unit 13. This is under assumption of a light incidence of high luminance as described by using FIG. 3B.

The period detection unit 15 causes the control signal PCON to transition from the high level to the low level when the width of a voltage pulse output to the node PDOUT (the length of a low level period) exceeds a predetermined time period. For example, as illustrated in FIG. 9, the period detection unit 15 causes the control signal PCON to transition from the high level to the low level at the time t11 when the length of a period in which a voltage pulse is at the low level exceeds a predetermined time period. Thereby, the selector unit 17 is in a state of selecting the signal DO2 [n−1:0] out of the signal DO1 [n−1:0] and the signal DO2 [n−1:0].

At the time t13, in response to the control signal PVSEL supplied from the vertical select circuit 21 being controlled to the high level, the selector unit 17 outputs the substitute signal value held by the substitute-signal generation unit 18 as the signal POUT [n−1:0]. FIG. 9 illustrates a case where the substitute-signal value held by the substitute-signal generation unit 18 is $2^n-1$ that is the maximum value in the n-bit counter as one example.

As described above, according to the present embodiment, in a photon-count type photoelectric conversion device, an error of a count value at high luminance can be reduced. This can improve the photoelectric conversion operation at high luminance.

Fourth Embodiment

Figure 10:
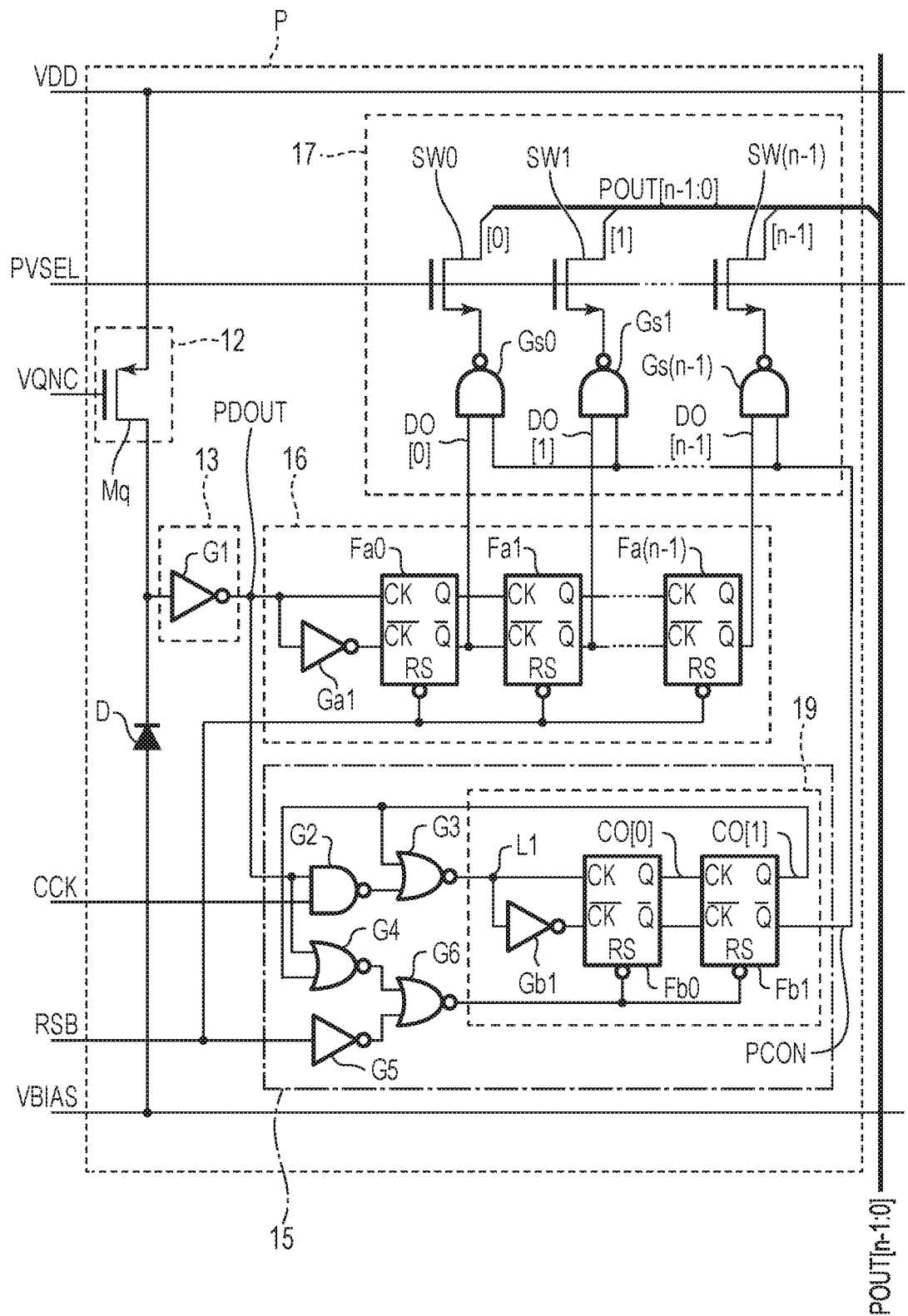
FIG. 10 is a schematic diagram illustrating a configuration example of a pixel of a photoelectric conversion device according to a fourth embodiment of the present invention.
Figure 11:
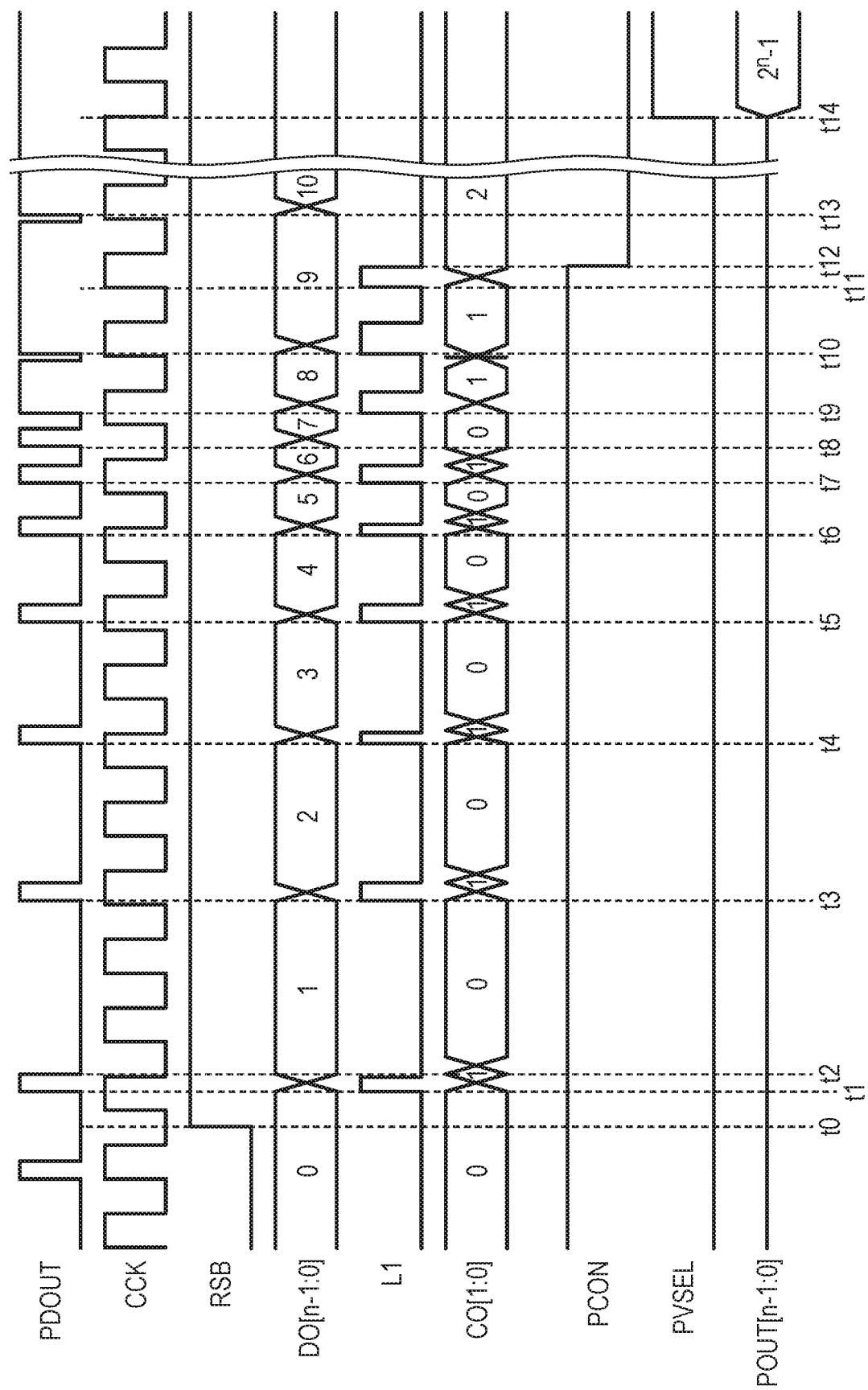
FIG. 11 is a timing diagram illustrating the operation of the pixel of the photoelectric conversion device according to the fourth embodiment of the present invention.

A photoelectric conversion device and a method of driving the same according to a fourth embodiment of the present invention will be described with reference to FIG. 10 and FIG. 11. Components similar to those of the photoelectric conversion device according to the first to third embodiments are labeled with the same references, and the description thereof will be omitted or simplified. FIG. 10 is a schematic diagram illustrating a configuration example of a pixel of the photoelectric conversion device according to the present embodiment. FIG. 11 is a timing diagram illustrating the operation of the pixel of the photoelectric conversion device according to the present embodiment.

In the present embodiment, another example of more specific configuration and operation of the pixel P will be described. The pixel P of the photoelectric conversion device according to the present embodiment includes an avalanche multiplying diode D, the quench unit 12, the pulse conversion unit 13, the period detection unit 15, the counter unit 16, and the selector unit 17 in a similar manner to the second embodiment described by using FIG. 6. The counter unit 16 and the selector unit 17 correspond to the signal generation unit 14 of FIG. 6.

The quench unit 12 may be formed of a p-channel MOS transistor Mq. The drain of the p-channel MOS transistor Mq is connected to the cathode of the diode D and the input terminal of the pulse conversion unit 13. The source of the p-channel MOS transistor Mq is connected to the power supply node to which the voltage VDD is supplied. The gate of the p-channel MOS transistor is connected to the power supply that supplies a voltage VQNC used for obtaining a predetermined quench resistance.

The pulse conversion unit 13 may be formed of an inverter circuit G1. The input terminal of the inverter circuit G1 corresponds to the input terminal of the pulse conversion unit 13, and the output terminal of the inverter circuit G1 corresponds to the output terminal of the pulse conversion unit 13.

The counter unit 16 includes a NOT circuit Ga1, and an n-bit counter formed of n flip-flop circuits Fa0 to Fa(n−1).

The output terminal of the inverter circuit G1, which is also the output terminal (node PDOUT) of the pulse conversion unit 13, is connected to one input terminal (CK) of the flip-flop circuit Fa0 and the input terminal of the NOT circuit Ga1. The output terminal of the NOT circuit Ga1 is connected to the other input terminal (/CK) of the flip-flop circuit Fa0. The flip-flop circuits Fa0 to Fa(n−1) are cascade-connected such that the output terminal of the flip-flop circuit Fam of a lower bit (m-th bit) and the input terminal of the flip-flop circuit Fa(m+1) of a higher bit ((m+1)-th bit) are connected to each other. For example, the output terminal (Q) of the flip-flop circuit Fa0 is connected to the input terminal (CK) of the flip-flop circuit Fa1, and the output terminal (/Q) of the flip-flop circuit Fa0 is connected to the input terminal (/CK) of the flip-flop circuit Fa1. Thereby, the counter unit 16 forms an n-bit counter that counts the number of voltage pulses output from the pulse conversion unit 13 to the node PDOUT.

The value of each bit of the signal DO [n−1:0] that is the output of the counter unit 16 is output from the output terminal (/Q) of each of the flip-flop circuits Fa0 to Fa(n−1). For example, the 0-th bit value (signal DO [0]) is output from the output terminal (/Q) of the flip-flop circuit Fa0. The first bit value (signal DO [1]) is output from the output terminal (/Q) of the flip-flop circuit Fa1. The (n−1)-th bit value (signal DO [n−1]) is output from the output terminal (/Q) of the flip-flop circuit Fa(n−1). Note that the configuration of a case of active low is illustrated here. Further, each reset terminal (RS) of the flip-flop circuit Fa0 to Fa(n−1) is commonly connected to a signal line to which the control signal RSB is supplied. Thereby, the counter unit 16 is able to reset the count value by the control signal RSB. That is, when the control signal RSB is at the low level, the count value of the counter unit 16 is reset.

The period detection unit 15 includes a logic circuit including a NAND circuit G2, NOR circuits G3, G4, and G6, and a NOT circuit G5 and a counter unit 19. The counter unit 19 includes a NOT circuit Gb1 and two-bit counter formed of two flip-flop circuits Fb0 and Fb1. Note that the counter unit 19 may be formed of a counter of three or more bits.

The output terminal (node PDOUT) of the inverter circuit G1 that is also the output terminal of the pulse conversion unit 13 is further connected to one input terminal of the NAND circuit G2 and one input terminal of the NOR circuit G4. The other input terminal of the NAND circuit G2 is connected to a signal line to which the clock signal CCK is supplied. The output terminal of the NAND circuit G2 is connected to one input terminal of the NOR circuit G3. The output terminal of the NOR circuit G4 is connected to one input terminal of the NOR circuit G6. The input terminal of the NOT circuit G5 is connected to the signal line to which the control signal RSB is supplied. The output terminal of the NOT circuit G5 is connected to other input terminal of the NOR circuit G6.

The output terminal of the NOR circuit G3 is connected to the input terminal (CK) of the flip-flop circuit Fb0 and the input terminal of the NOT circuit Gb1. The output terminal of the NOT circuit Gb1 is connected to the input terminal (/CK) of the flip-flop circuit Fb0. The output terminal of the NOR circuit G6 is connected to the reset terminals (RS) of the flip-flop circuit Fb0 and Fb1. The output terminal (Q) of the flip-flop circuit Fb0 is connected to the input terminal (CK) of the flip-flop circuit Fb1. The output terminal (/Q) of the flip-flop circuit Fb0 is connected to the input terminal (/CK) of the flip-flop circuit Fb1. Thereby, the counter unit 19 forms a two-bit counter that counts the number of voltage pulses output from the NOR circuit G3 to the node L1 that is the input terminal. The value of the signal CO [0] output from the output terminal (Q) of the flip-flop circuit Fb0 corresponds to the 0-th bit value of the count value of the counter unit 19. Further, the value of the signal CO [1] output from the output terminal (Q) of the flip-flop circuit Fb1 corresponds to the first bit value of the count value of the counter unit 19. The output terminal (Q) of the flip-flop circuit Fb1 is connected to the other input terminal of the NOR circuit G3 and the other input terminal of the NOR circuit G4.

Thereby, the clock signal CCK obtained when the output Q of the flip-flop circuit Fb1 is at the low level and the node PDOUT is at the high level is selectively input to the node L1 corresponding to the input terminal of the counter unit 19. That is, the counter unit 19 is configured to count the number of clock signals CCK input when the output Q of the flip-flop circuit Fb1 is at the low level and the node PDOUT is at the high level. Note that the output Q of the flip-flop circuit Fb1 is at the low level when the count value of the counter unit 19 is less than or equal to one (1).

Further, the counter unit 19 is configured such that the counter value of the counter unit 19 is reset when the control signal RSB is at the low level, otherwise when the output Q of the flip-flop circuit Fb1 is at the low level and the node PDOUT is at the low level.

As a result, the counter unit 19 counts the number of clock signals CCK for each period in which the most significant bit value is zero (0) (the output Q of the flip-flop circuit Fb1 is at the low level) and the node PDOUT is at the high level. Therefore, the count value indicated by the counter unit 19 serves as an index representing the length of a period in which the voltage pulse output to the node PDOUT is continuously at the high level, that is, the width of a voltage pulse.

The selector unit 17 includes n switches SW0 to SW(n−1) and n NAND circuits Gs0 to Gs(n−1) in association with respective bits of the counter unit 16. Each of the switches SW0 to SW(n−1) may be formed of an n-channel MOS transistor, for example.

One input terminals of the NAND circuits Gs0, GS1, . . . , Gs(n−1) are connected to the output terminals (/Q) of the flip-flop circuits Fa0, Fa1, . . . , Fa(n−1) of the counter unit 16, respectively. The other input terminals of the NAND circuits Gs0, Gs1, . . . , Gs(n−1) are commonly connected to the output terminal (/Q) of the flip-flop circuits Fb1 of the counter unit 19. The signal output from the output terminal (/Q) of the flip-flop circuit Fb1 of the counter unit 19 is the control signal PCON.

The output terminal of the NAND circuit Gs0 is connected to the source of the n-channel MOS transistor forming the switch SW0. Similarly, the output terminal of the NAND circuit Gs1 is connected to the source of the n-channel MOS transistor forming the switch SW1. Each of the drains of the n-channel MOS transistors forming the switches SW0, SW1, . . . , SW(n−1) is connected to a signal line of the corresponding bit of the output line POUT formed of n signal lines. The gates of the n-channel MOS transistors forming the switches SW0 and SW1 are connected to the control line to which the control signal PVSEL is supplied from the vertical select circuit 21.

Thereby, the selector unit 17 outputs the signals DO [0], DO [1], . . . , DO [n−1] to signal lines of the corresponding bits of the output line POUT formed of n signal lines if the control signal PCON is at the high level when the control signal PVSEL is at the high level. That is, the signal POUT [n−1:0] output to the output line POUT is the same as the signal DO [n−1:0] output by the counter unit 16. Further, the selector unit 17 outputs a high level signal to all the signal lines of the output line POUT formed of n signal lines if the control signal PCON is at the low level when the control signal PVSEL is at the high level. That is, the count value represented by the signal POUT [n−1:0] output to the output line POUT is $2^n-1$ that is the maximum value in the n-bit counter.

FIG. 11 is a timing diagram illustrating a relationship of the potentials of the nodes PDOUT and L1, the clock signal CCK, the control signals RSB, PCON, and PVSEL, and signals DO [n−1:0], CO [1:0], and POUT [n−1:0].

In the period before the time t0, the control signal RSB is at the low level. As described previously, when the control signal RSB is at the low level, the counter unit 16 and the counter unit 19 are in a reset state. The count value indicated by the signal DO [n−1:0] output by the counter unit 16 and the count value indicated by the signal CO [1:0] output by the counter unit 19 are both zero (0). The control signal PCON transitions to the high level in response to the output (/Q) of the flip-flop circuit Fb1. Further, in the period before the time t0, the control signal PVSEL is at the low level.

At the time t0, the control signal RSB is controlled from the low level to the high level, and the reset state of the counter unit 16 is released. Once a photon enters the diode D, a voltage pulse in accordance with the incidence timing of the photon is output from the pulse conversion unit 13 to the node PDOUT. In the present embodiment in which the pulse conversion unit 13 is formed of the inverter circuit G1, the node PDOUT is at the low level when there is no photon incidence, and the node PDOUT is at the high level in response to the photon incidence. The counter unit 16 counts the number of voltage pulses output to the node PDOUT and outputs the signal DO [n−1:0] indicating the count value.

After the time t0, at the timings of the time t1, t3, t4, t5, t6, t7, t8, t9, t10, and t13, voltage pulses occur at the node PDOUT. The counter unit 16 counts the number of these voltage pulses. The count value of the counter unit 16 becomes decimal 10 when counted up to the voltage pulse rising at the time t13.

On the other hand, once the node PDOUT transitions to the high level, the output of the NAND circuit G2 transitions to the low level in synchronization with the clock signal CCK. Thereby, a voltage pulse synchronized with the voltage pulse occurring at the node PDOUT and the clock signal CCK is output to the node L1 that is the output terminal of the NOR circuit G3. Further, in response to the transition of the node PDOUT to the high level, the output of the NOR circuit G4 transitions to the low level, and the reset state of the counter unit 19 is released. Thereby, the counter unit 19 counts the number of voltage pulses output to the node L1.

The count operation by the counter unit 19 is continuously performed during only the period in which the node PDOUT is at the high level. In response to the transition of the node PDOUT to the low level, the counter unit 19 returns to the reset state. For example, once a voltage pulse is output from the pulse conversion unit 13 at the time t1, the node PDOUT transitions to the high level, and the node L1 transitions to the high level, the counter unit 19 counts this voltage pulse, and the count value of the counter unit 19 becomes one (1). In response to the transition of the node PDOUT to the low level at the time t2, the counter unit 19 is in a reset state, and the count value of the counter unit 19 returns to zero (0).

At the time t12, the most significant bit value of the counter unit 19 becomes one (1). This corresponds to a case where the count value of the counter unit 19 becomes decimal two (2) in the example illustrated in FIG. 10. Then, the output (Q) of the flip-flop circuit Fb1 corresponding to the most significant bit transitions to the high level, the node L1 is fixed to the low level, and counting up in the counter unit 19 stops. Further, the control signal PCON that is the output (/Q) of the flip-flop circuit Fb1 transitions from the high level to the low level.

The control signal PVSEL transitions from the low level to the high level at the time t14 after the time t12, and a high level signal is output to all the signal lines of the output line POUT formed of n signal lines. That is, the count value represented by the signal POUT [n−1:0] output to the output line POUT becomes $2^n-1$ that is the maximum value in the n-bit counter.

Note that, in FIG. 11, when the control signal PVSEL transitions from the low level to the high level at a timing before the time t12, the signal POUT [n−1:0] that is the same as the signal DO [n−1:0] output by the counter unit 16 is output to the output line POUT.

As described above, the period detection unit 15 detects the width of a voltage pulse output to the node PDOUT from the pulse conversion unit 13 by using the counter unit 19 synchronized with the clock signal CCK and outputs the control signal PCON whose state transitions in accordance with a predetermined threshold value to the selector unit 17. Thereby, the selector unit 17 can select either a photon-count signal or a predetermined fixed signal as the output signal of the pixel P. It is therefore possible to determine whether or not an incidence rate of photons entering each pixel P is above an occurrence rate of voltage pulses, and it is possible to reduce an error of a count value at high luminance.

As discussed above, according to the present embodiment, in a photon-count type photoelectric conversion device, an error of a count value at high luminance can be reduced. This can improve the photoelectric conversion operation at high luminance.

Fifth Embodiment

Figure 12:
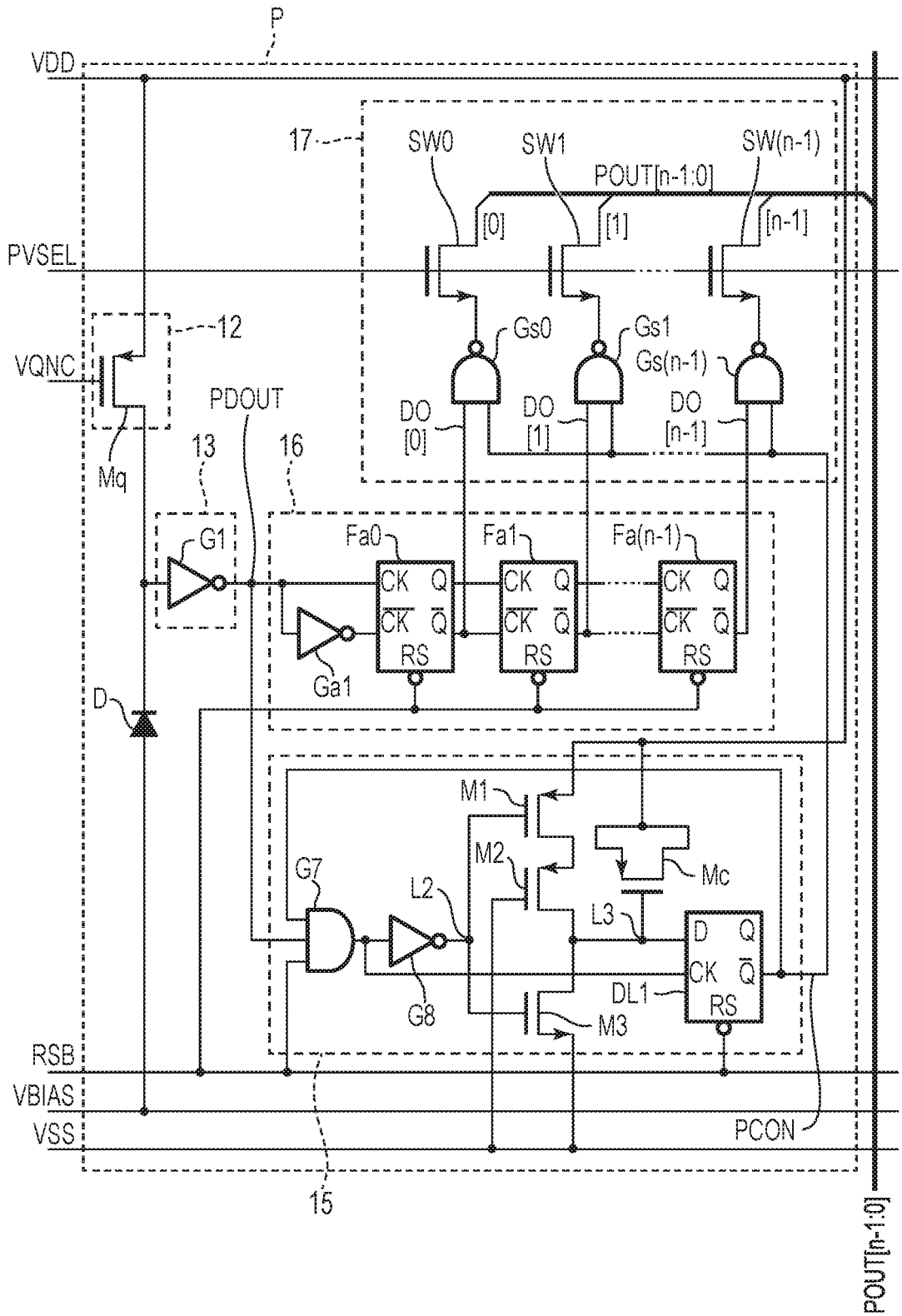
FIG. 12 is a schematic diagram illustrating a configuration example of a pixel of a photoelectric conversion device according to a fifth embodiment of the present invention.
Figure 13:
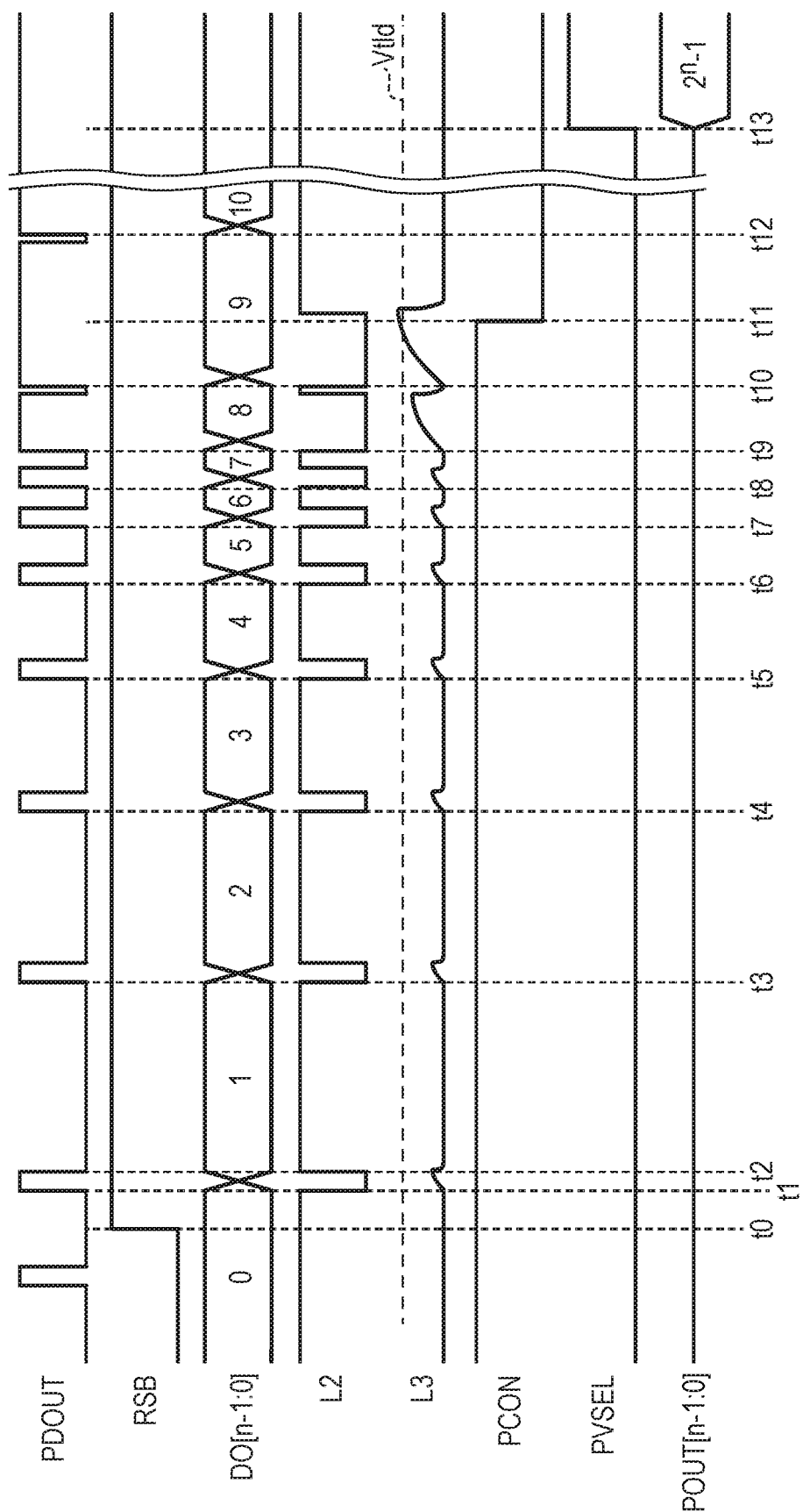
FIG. 13 is a timing diagram illustrating the operation of the pixel of the photoelectric conversion device according to the fifth embodiment of the present invention.

A photoelectric conversion device and a method of driving the same according to a fifth embodiment of the present invention will be described with reference to FIG. 12 and FIG. 13. Components similar to those of the photoelectric conversion device according to the first to fourth embodiments are labeled with the same references, and the description thereof will be omitted or simplified. FIG. 12 is a schematic diagram illustrating a configuration example of a pixel of the photoelectric conversion device according to the present embodiment. FIG. 13 is a timing diagram illustrating the operation of the pixel of the photoelectric conversion device according to the present embodiment.

In the present embodiment, another example of more specific configuration and operation of the pixel P will be described. The pixel P of the photoelectric conversion device according to the present embodiment is the same as the pixel P of the photoelectric conversion device according to the fourth embodiment described by using FIG. 11 except for the configuration of the period detection unit 15. As illustrated in FIG. 12, the period detection unit 15 of the pixel P in the present embodiment includes a logic circuit including an AND circuit G7 and a NOT circuit G8, p-channel MOS transistors M1, M2, and Mc, an n-channel MOS transistor M3, and a latch circuit DL1.

The output terminal (node PDOUT) of the inverter circuit G1 that is also the output terminal of the pulse conversion unit 13 is connected to one of the three input terminals of the AND circuit G7. The other two of the three input terminals of the AND circuit G7 are connected to the signal line to which the control signal RSB is supplied and the output terminal (/Q) of the latch circuit DL1. The output terminal of the AND circuit G7 is connected to the input terminal of the NOT circuit G8 and the clock terminal (CK) of the latch circuit DL1.

The node L2 that is the output terminal of the NOT circuit G8 is connected to the gate of the p-channel MOS transistor M1 and the gate of the n-channel MOS transistor M3. The source of the p-channel MOS transistor M1 is connected to the power supply node to which the voltage VDD is supplied. The drain of the p-channel MOS transistor M1 is connected to the source of the p-channel MOS transistor M2. The gate of the p-channel MOS transistor M2 and the source of the n-channel MOS transistor M3 are connected to the power supply node to which the voltage VSS is supplied.

The drain of the p-channel MOS transistor M2 and the drain of the n-channel MOS transistor M3 are connected to the gate of the p-channel MOS transistor Mc and the input terminal (D) of the latch circuit DL1. The connection part of the drain of the p-channel MOS transistor M2, the drain of the n-channel MOS transistor M3, the gate of the p-channel MOS transistor Mc, and the input terminal (D) of the latch circuit DL1 is the node L3. The source and the drain of the p-channel MOS transistor Mc are connected to the power supply node to which the voltage VDD is supplied. The reset terminal (RS) of the latch circuit DL1 is connected to a signal line to which the control signal RSB is supplied. The output terminal (/Q) of the latch circuit DL1 is connected to the other input terminals of the NAND circuits Gs0, Gs1, . . . , Gs(n−1) of the selector unit 17, respectively. The signal output from the output terminal (/Q) of the latch circuit DL1 is the control signal PCON.

The source and the drain of the p-channel MOS transistor Mc are commonly connected to the power supply node to which the voltage VDD is supplied and form a MOS capacitor used for forming an integration circuit. An inverted signal of the node PDOUT propagates to the node L2 when the control signal RSB and the control signal PCON are at the high level. The p-channel MOS transistor M1 and the n-channel MOS transistor M3 form an inverter circuit in which the node L2 is the input terminal and the node L3 is the output terminal. The p-channel MOS transistors M1, M2, and Mc and the n-channel MOS transistor M3 are configured such that a response of the node L3 corresponding to the node L2 rises slow and falls fast.

FIG. 13 is a timing diagram illustrating a relationship of the potentials of the nodes PDOUT, L2, and L3, the control signals RSB, PCON, and PVSEL, and the signals DO [n−1:0] and POUT [n−1:0].

In the period before the time t0, the control signal RSB is at the low level. When the control signal RSB is at the low level, the counter unit 16 and the latch circuit DL1 are in a reset state. That is, the count value indicated by the signal DO [n−1:0] output by the counter unit 16 is zero (0). Further, the control signal PCON transitions to the high level in response to the output (/Q) of the latch circuit DL1. Further, in the period before the time t0, the control signal PVSEL is at the low level.

At the time t0, the control signal RSB is controlled from the low level to the high level, and the reset state of the counter unit 16 is released. Once a photon enters the diode D, a voltage pulse in accordance with the incidence timing of the photon is output from the pulse conversion unit 13 to the node PDOUT. The counter unit 16 counts the number of voltage pulses output to the node PDOUT and outputs the signal DO [n−1:0] indicating the count value.

After the time t0, at the timings of the time t1, t3, t4, t5, t6, t7, t8, t9, t10, and t12, voltage pulses occur at the node PDOUT. The counter unit 16 counts the number of these voltage pulses. The count value of the counter unit 16 becomes decimal 10 when counted up to the voltage pulse rising at the time t12.

At the time t1, once the node L2 transitions to the low level in response to a change in the potential of the node PDOUT, the potential of the node L3 starts rising. At the time t2, when the node L2 returns to the high level, the potential of the node L3 immediately falls and reaches the low level. The potential of the node L3 is higher when the period of the node L2 being the low level is longer, that is, when the incident light amount is larger. When the incident light amount is small and incidence of a photon corresponds to occurrence of a voltage pulse in a one-to-one manner, the potential of the node L3 does not exceed a threshold value Vtld of the latch circuit LD1, and the control signal PCON remains at the high level. Then, similarly, the count operation by the counter unit 16 is performed from the time t3 to the time t10.

At the time t11, the potential of the node L3 exceeds the threshold value Vtld of the latch circuit LD1. In response, a latch operation by the latch circuit LD1 is performed, and the control signal PCON that is the output (/Q) of the latch circuit LD1 transitions from the high level to the low level. Thereby, the node L2 transitions to the high level, and the potential of the node L3 immediately falls and reaches the low level.

At the subsequent time t12, in response to occurrence of a voltage pulse at the node PDOUT, while the count operation of the counter unit 16 is performed, the control signal PCON is at the low level and thus the node L2 remains at the high level. As a result, the control signal PCON is maintained at the low level.

When the control signal PVSEL transitions from the low level to the high level at the time t13 after the time t11, the selector unit 17 outputs a high level signal to all the signal lines of the output line POUT formed of n signal lines in response to the low level control signal PCON. That is, the count value represented by the signal POUT [n−1:0] output to the output line POUT becomes $2^n-1$ that is the maximum value in the n-bit counter.

Note that, in FIG. 13, when the control signal PVSEL transitions from the low level to the high level at a timing before the time t11, the signal POUT [n−1:0] that is the same as the signal DO [n−1:0] output by the counter unit 16 is output to the output line POUT.

As described above, the period detection unit 15 detects the width of a voltage pulse output to the node PDOUT from the pulse conversion unit 13 by utilizing the response speed of a signal synchronized with a voltage pulse and outputs the control signal PCON whose state transitions in accordance with a predetermined threshold value to the selector unit 17. Thereby, the selector unit 17 can select either a photon-count signal or a predetermined fixed signal as the output signal of the pixel P. It is therefore possible to determine whether or not an incidence rate of photons entering each pixel P is above an occurrence rate of voltage pulses, and it is possible to reduce an error of a count value at high luminance.

The photoelectric conversion device according to the present embodiment has less elements than the photoelectric conversion device according to the fourth embodiment and, in addition, requires no clock signal line and thus enables high integration.

As discussed above, according to the present embodiment, in a photon-count type photoelectric conversion device, an error of a count value at high luminance can be reduced. This can improve the photoelectric conversion operation at high luminance.

Sixth Embodiment

A photoelectric conversion device according to the sixth embodiment of the present invention will be described with reference to FIG. 14. In the present embodiment, a reverse bias voltage applied to the diode D is controlled so that the diode D transitions from a Geiger mode to a non-Geiger mode when the width of a voltage pulse output to the node PDOUT (the length of a low level period) exceeds a predetermined time period. The period detection unit 15 performs control of the reverse bias voltage applied to the diode D.

Figure 14:
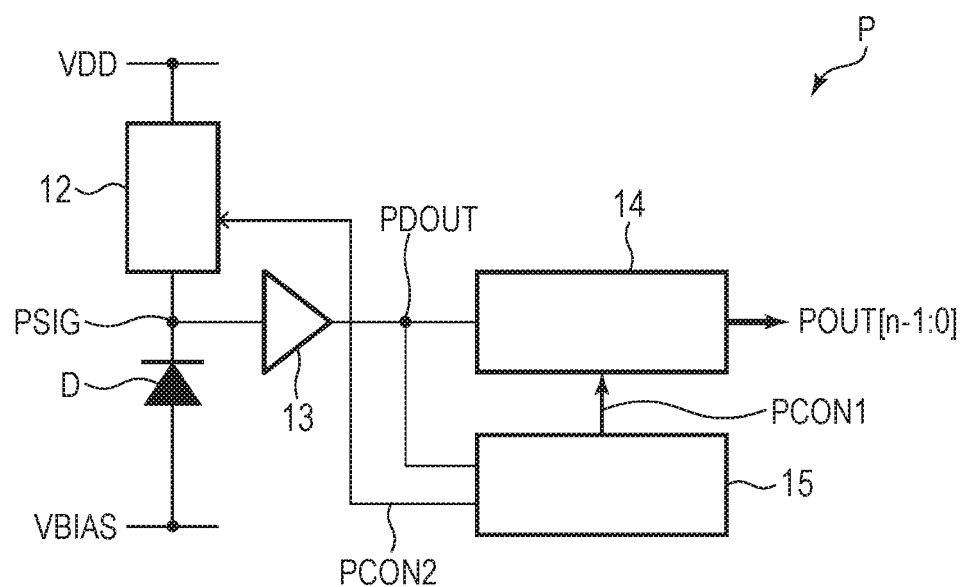
FIG. 14 is a schematic diagram illustrating a configuration example of a pixel of a photoelectric conversion device according to a sixth embodiment of the present invention.

FIG. 14 illustrates a configuration example of the pixel P in the photoelectric conversion device according to the present embodiment. In the present embodiment, the period detection unit 15 outputs a control signal PCON2 to the quench unit 12. Note that the control signal PCON1 of FIG. 14 is the control signal PCON of the first embodiment.

The control signal PCON2 is also a signal whose state transitions when the width of a voltage pulse indicating a photon incidence exceeds a predetermined threshold value in the same manner as the control signal PCON1.

As described also in the first embodiment, a reverse bias voltage greater than or equal to the breakdown voltage is applied to the diode D via the quench unit 12 from the power supply node that supplies the voltage VDD or VBIAS in a Geiger mode. When the control signal PCON2 is at the high level, the quench unit 12 performs the same operation as that of the first embodiment. That is, there is a state where avalanche multiplication is enabled as a Geiger mode, and occurrence of avalanche multiplication results in transition to a non-Geiger mode. Then, the mode again transitions to a Geiger mode. On the other hand, once the control signal PCON2 changes from the high level to the low level, the quench unit 12 operates so as not to perform transition from the non-Geiger mode to the Geiger mode. For example, the voltage VQNC is controlled to a voltage that turns off the channel MOS transistor Mq, and the electrical path between the voltage VDD and the diode D is disconnected. Thereby, after transitioning from the Geiger mode to the non-Geiger mode by avalanche multiplication, the diode D does not return to the Geiger mode and is maintained in the non-Geiger mode for a predetermined period. This predetermined period can be a period from the time of transition to the non-Geiger mode to the time of start of an exposure period corresponding to the next frame, for example.

Thereby, since it is possible to prevent avalanche multiplication from occurring in the diode D, power consumption of the diode D can be reduced.

Note that, while the control signal PCON1 is output to the signal generation unit 14 as the control signal PCON of the first embodiment in the present embodiment, the power consumption of the diode D can be reduced by not outputting the control signal PCON1, and thus the present embodiment is established.

Further, while the quench unit 12 is controlled by the control signal PCON2 in the present embodiment, the diode D may be maintained in the non-Geiger mode for a predetermined period by controlling one or both of the voltage VDD and the voltage VBIAS. Alternatively, a switch may be provided between the diode D and the node of the voltage VBIAS, and the switch may be controlled to be non-conductive when the control signal PCON2 is at the low level.

According to the present embodiment, power consumption of the diode D at high luminance can be reduced. Thereby, heat generation of the photoelectric conversion device due to an increase in power consumption can be reduced, and malfunction of other pixels P of the photoelectric conversion device (fluctuation of the operation point of avalanche multiplication, an unstable operation of the pixels P, or the like) can also be suppressed.

Note that the present embodiment has been described based on the configuration of the first embodiment but can be applied to other embodiments.

Seventh Embodiment

Figure 15:
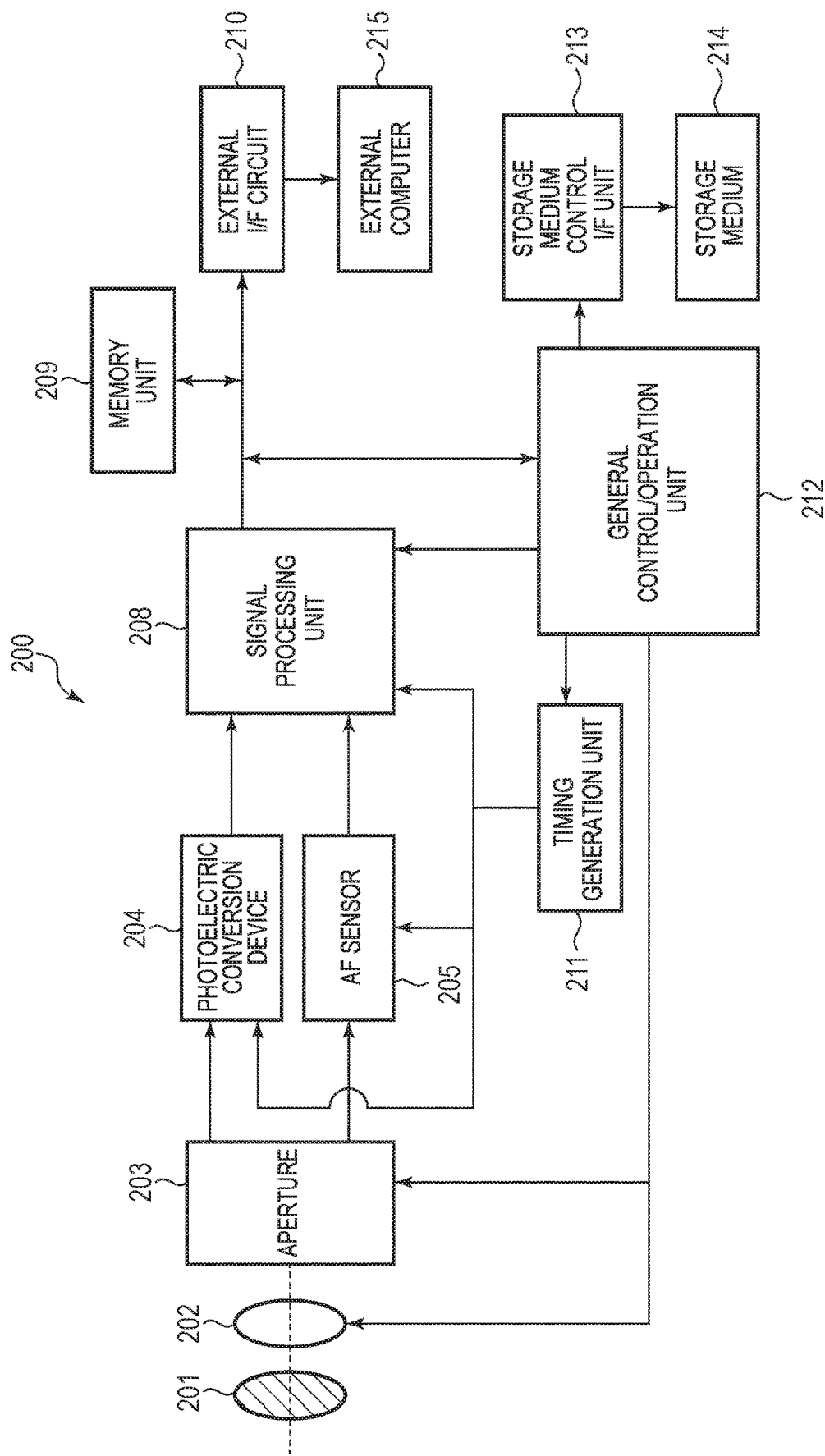
FIG. 15 is a block diagram illustrating a general configuration of an imaging system according to a seventh embodiment of the present invention.

An imaging system according to a seventh embodiment of the present invention will be described by using FIG. 15. FIG. 15 is a block diagram illustrating a configuration example of the imaging system according to the present embodiment.

As illustrated in FIG. 15, an imaging system 200 according to the present embodiment includes a barrier 201, a lens 202, an aperture 203, a photoelectric conversion device 204, and an AF sensor 205. The lens 202 is an optical system used for capturing an optical image of an object. The barrier 201 protects the lens 202. The aperture 203 is for adjusting the light amount of a light passing through the lens 202. The photoelectric conversion device 204 is formed by using the photoelectric conversion device 100 described in the first to sixth embodiments, which is for acquiring an optical image of an object captured by the lens 202 as an image signal. The AF sensor 205 is for acquiring a signal necessary for focus detection.

Further, the imaging system 200 further includes a signal processing unit 208. The signal processing unit 208 is for performing a process of a signal output from the photoelectric conversion device 204 or the AF sensor 205 or a process to perform various correction on the acquired image data or a process to compress data.

Further, the imaging system 200 further includes a memory unit 209, an external I/F circuit 210, a timing generation unit 211, a general control/operation unit 212, and a storage medium control I/F unit 213. The memory unit 209 is for temporarily store image data. The external I/F circuit 210 is for communicating with an external device such as an external computer 215. The timing generation unit 211 is for outputting various timing signals to the signal processing unit 208 or the like. The general control/operation unit 212 is for controlling various calculation and the entire camera. The storage medium control I/F unit 213 is for communicating data with a removable storage medium 214 such as a semiconductor memory used for storing acquired image data or reading out image data.

When the barrier 201 is opened, an optical image from the object enters the AF sensor 205 via the lens 202 and the aperture 203. The general control/operation unit 212 calculates a distance to the object by using the phase difference detection scheme described above based on an output signal from the AF sensor 205. The general control/operation unit 212 then drives the lens 202 based on the calculation result, again determines whether or not focusing is obtained on the capturing surface, and when determining that focusing is not obtained, performs autofocus control to drive the lens 202 again.

Next, after focusing is confirmed, a charge accumulation operation by the photoelectric conversion device 204 is started. Upon the completion of the charge accumulation operation of the photoelectric conversion device 204, an image signal output from the photoelectric conversion device 204 is written to the memory unit 209 by the general control/operation unit 212 via the signal processing unit 208. The data accumulated in the memory unit 209 is then stored in the storage medium 214 via the storage medium control I/F unit 213 by the control of the general control/operation unit 212. Alternatively, data accumulated in the memory unit 209 may be directly input to the external computer 215 or the like via the external I/F circuit 210.

As described in the first to sixth embodiments, a use of the photoelectric conversion device 100 illustrated in the above embodiments can reduce an error of a count value at high luminance. Therefore, according to the imaging system of the present embodiment using the photoelectric conversion device 204, a higher quality image can be acquired.

Eighth Embodiment

Figure 16A:
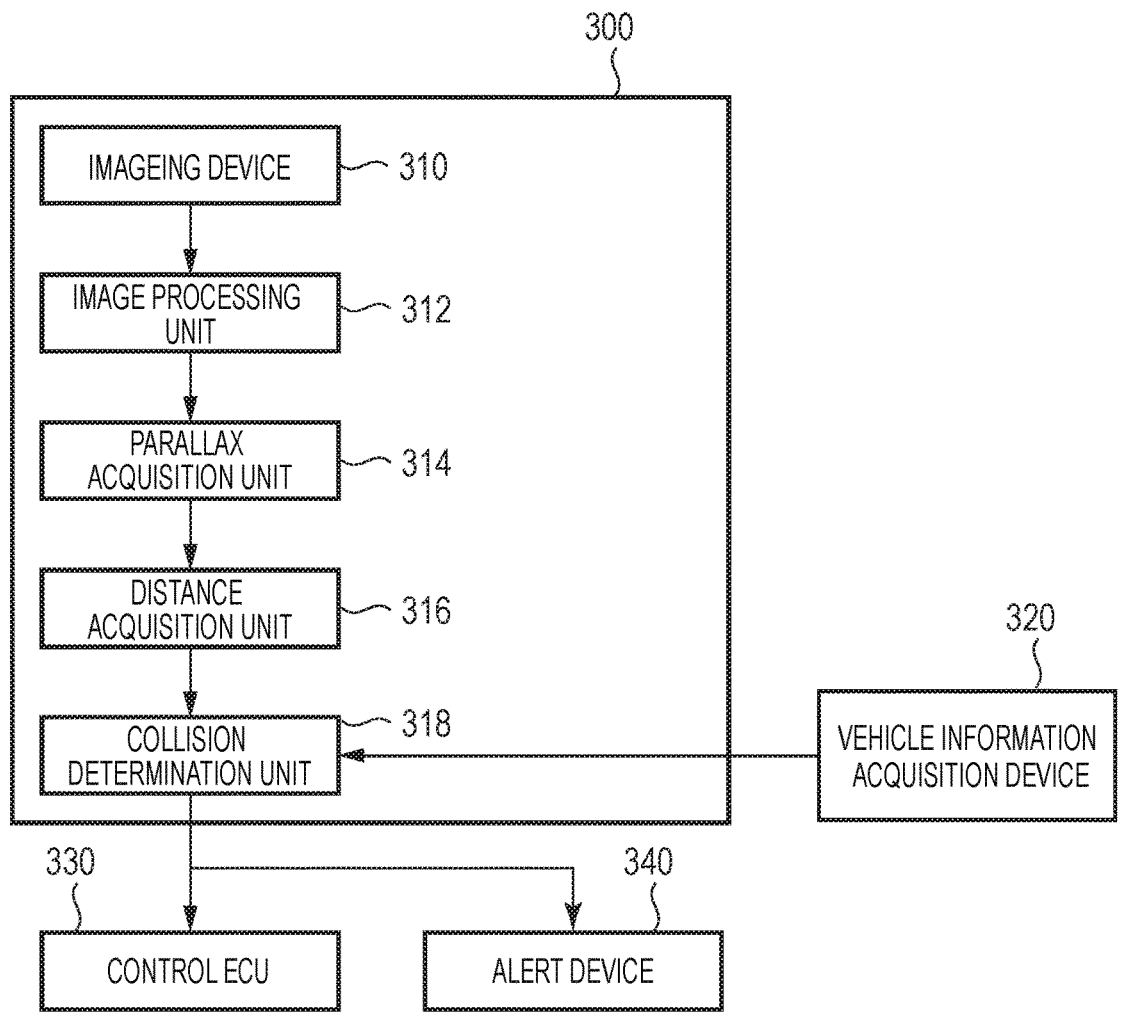
FIG. 16A is a diagram illustrating a configuration example of an imaging system according to an eighth embodiment of the present invention.
Figure 16B:
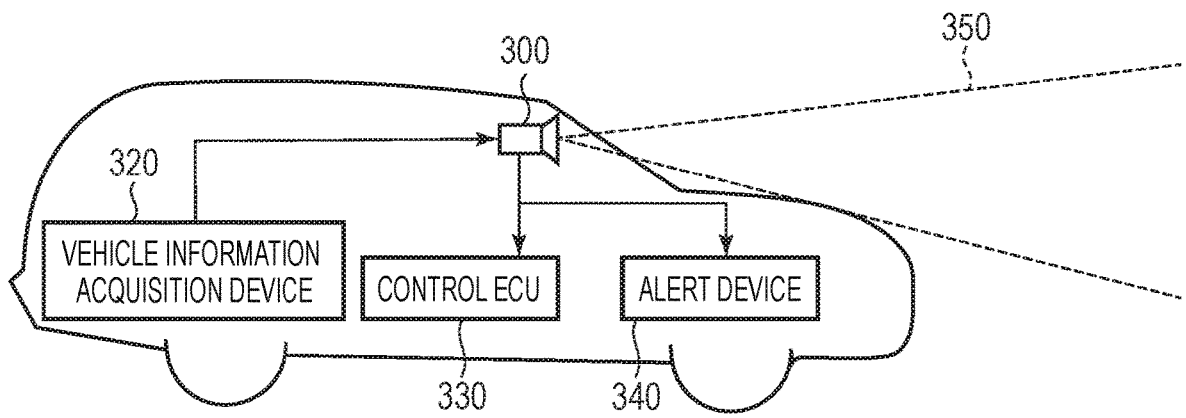
FIG. 16B is a diagram illustrating a configuration example of a movable object according to the eighth embodiment of the present invention.

An imaging system and a movable object according to an eighth embodiment of the present invention will be described by using FIG. 16A and FIG. 16B. FIG. 16A is a diagram illustrating a configuration of an imaging system according to the present embodiment. FIG. 16B is a diagram illustrating a configuration of a movable object according to the present embodiment.

FIG. 16A illustrates an example of an imaging system related to an on-vehicle camera. An imaging system 300 includes an imaging device 310. The imaging device 310 is the photoelectric conversion device 100 described in any of the above first to sixth embodiments. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 includes a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition device that acquires distance information on the distance to the object. That is, the distance information is information on a parallax, a defocus amount, a distance to an object, or the like. The collision determination unit 318 may use any of the above distance information to determine the collision possibility. The distance information acquisition device may be implemented by dedicatedly designed hardware or may be implemented by a software module. Further, the distance information acquisition device may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 16B illustrates the imaging system when a front area of a vehicle (a capturing area 350) is captured. The vehicle information acquisition device 320 transmits an instruction to the imaging system 300 or the imaging device 310. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, the pixel circuit forming the pixel P in the photoelectric conversion device of the first to sixth embodiments described above is not limited to those illustrated.

Further, the counter circuit forming the counter unit 19 of the period detection unit 15 is formed of a two-bit counter in the fourth embodiment described above but may be formed of three or more-bit counter. The counter circuit forming the counter unit 19 may be changed suitably in accordance with the voltage pulse width that is a reference.

Further, the imaging systems illustrated in the above seventh and eighth embodiments are an imaging system example to which the photoelectric conversion device of the present invention may be applied, and the imaging system to which the photoelectric conversion device of the present invention can be applied is not limited to the configuration illustrated in FIG. 15 and FIG. 16A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-167086, filed Sep. 6, 2018, which is hereby incorporated by reference herein in its entirety.

What is claimed is:

1. A photoelectric conversion device comprising a plurality of pixels, each of the plurality of pixels including:
   a light receiving portion that outputs a pulse in response to incidence of a photon;
   a signal generation unit that outputs a signal based on output from the light receiving portion; and
   a detection unit that detects whether or not a width of a pulse output from the light receiving portion exceeds a predetermined threshold value,
   wherein the signal generation unit includes a counter configured to count pulses output from the light receiving portion, and
   wherein the detection unit is connected to a node connected to the light receiving portion and the counter.

2. The photoelectric conversion device according to claim 1, wherein the signal generation unit is configured to generate the signal based on a detection result from the detection unit and a pulse count value of the counter.

3. The photoelectric conversion device according to claim 2, wherein the signal generation unit is configured to:
   output the signal indicating the pulse count value of the counter when the width of the pulse is less than or equal to the threshold value, and
   output the signal indicating a predetermined value when the width of the pulse exceeds the threshold value.

4. The photoelectric conversion device according to claim 3, wherein the predetermined value is a pulse count value corresponding to a light amount when an incidence rate of photons to the light receiving portion is above an occurrence rate of pulses at the light receiving portion.

5. The photoelectric conversion device according to claim 1, wherein the signal generation unit is configured to:
   output the signal indicating a pulse count value of the counter when the width of the pulse is less than or equal to the threshold value, and
   stop counting by the counter and output the signal indicating the pulse count value of the counter when the width of the pulse exceeds the threshold value.

6. The photoelectric conversion device according to claim 1, wherein the detection unit includes a control unit that controls the signal generation unit in response to a detection result.

7. The photoelectric conversion device according to claim 6, wherein the control unit includes a latch circuit whose state transitions when a width of a pulse detected by the detection unit exceeds the threshold value.

8. The photoelectric conversion device according to claim 1, wherein the detection unit includes a counter circuit used for detecting the width of the pulse.

9. The photoelectric conversion device according to claim 1, wherein the detection unit includes an integration circuit used for detecting the width of the pulse.

10. The photoelectric conversion device according to claim 1, wherein the threshold value is larger than a width of a pulse generated by incidence of one photon.

11. The photoelectric conversion device according to claim 1, wherein the light receiving portion includes
   a diode that operates in a Geiger mode and outputs a signal in accordance with incidence of a photon,
   a quench unit that causes the diode to transition to a non-Geiger mode in response to the signal output from the diode, and a pulse conversion unit that converts an output signal of the diode into a pulse signal.

12. The photoelectric conversion device according to claim 11, wherein when it is detected by the detection unit that a width of a pulse output from the light receiving portion exceeds the threshold value, the diode is maintained in the non-Geiger mode for a predetermined period.

13. The photoelectric conversion device according to claim 12,
wherein the quench unit is provided on an electrical path between a power supply node and the diode, and
wherein when it is detected by the detection unit that a width of a pulse output from the light receiving portion exceeds the threshold value, the diode is maintained in the non-Geiger mode for a predetermined period by the quench unit being non-conductive.

14. An imaging system comprising:
the photoelectric conversion device according to claim 1; and
a signal processing unit that processes a signal output from the photoelectric conversion device.

15. A movable object comprising:
the photoelectric conversion device according to claim 1;
a distance information acquisition device that acquires distance information on a distance to an object, from a parallax image based on signals from the photoelectric conversion device; and
a control device that controls the movable object based on the distance information.

16. A method of driving a photoelectric conversion device including a light receiving portion that outputs a pulse in response to incidence of a photon and a signal generation unit that outputs a signal based on output from the light receiving portion, and a detection unit, the method comprising:
outputting a pulse output from the light receiving portion parallelly to the signal generation unit and to the detection unit;
generating, by the signal generation unit, a count value by counting the pulses; and
detecting, by the detection unit, whether or not a width of the pulse exceeds a predetermined threshold value.

17. The method of driving the photoelectric conversion device according to claim 16, the method further comprising:
outputting the signal indicating the count value when the width of the pulse is less than or equal to the threshold value; and
outputting the signal indicating a predetermined value when the width of the pulse exceeds the threshold value.

18. The method of driving the photoelectric conversion device according to claim 16, the drive method further comprising:
stopping counting of the pulse and outputting the signal indicating the count value at the time of stopping counting when the width of the pulse exceeds the threshold value.

* * * * *